(12) United States Patent
Lytle et al.

(10) Patent No.: US 6,294,928 B1
(45) Date of Patent: *Sep. 25, 2001

(54) PROGRAMMABLE LOGIC DEVICE WITH HIGHLY ROUTABLE INTERCONNECT

(75) Inventors: Craig S. Lytle, Mountain View; Kerry S. Veenstra, San Jose; Francis B. Heile, Santa Clara, all of CA (US)

(73) Assignee: Altera Corporation, San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/838,398

(22) Filed: Apr. 3, 1997

Related U.S. Application Data
(60) Provisional application No. 60/014,942, filed on Apr. 5, 1996, and provisional application No. 60/015,122, filed on Apr. 10, 1996.

(51) Int. Cl.[7] ............................. H01L 25/00; H03K 19/177
(52) U.S. Cl. ................................. 326/41; 326/34; 326/40; 326/47
(58) Field of Search ................................. 326/38–41, 47

(56) References Cited

U.S. PATENT DOCUMENTS

| | | |
|---|---|---|
| Re. 34,363 | 8/1993 | Freeman . |
| 3,473,160 | 10/1969 | Wahlstrom ........................ 340/175.5 |

(List continued on next page.)

FOREIGN PATENT DOCUMENTS 1444084   7/1976   (GB) .

OTHER PUBLICATIONS

"FLEX 8000," Altera Data Book, Chapter 3, 1995, pp. 35–115.
"MAX 9000," Altera Data Book, Chapter 4, 1995, pp. 117–152.

(List continued on next page.)

*Primary Examiner*—Michael Tokar
*Assistant Examiner*—Steven S. Paik
(74) *Attorney, Agent, or Firm*—Townsend and Townsend and Crew

(57) ABSTRACT

A programmable logic device architecture with a highly routable programmable interconnect structure. The arrangement of the logic array blocks (LABs), programmable interconnect structure, and other logical elements forms a Clos network. After specific constraints have been met, the architecture is guaranteed to route. The architecture is provably routable when there is no fan-out in the middle stage. A LAB (A-200) comprises an input multiplexer region (A-504), logic elements (A-300), input-output pins (A-516), and output multiplexer region (A-508). Furthermore, a logic device and a method of operating a logic device. The device includes logic elements (B-240) that perform desired logic functions and routing functions. The logic elements (B-240) are arranged in larger logic blocks known as logic array blocks (B-230) that have local interconnection systems. The logic array blocks (B-230) are configured to provide global interconnections. The configuration provides a Clos network, whereby a signal may be routed from any input to any output without blocking.

19 Claims, 13 Drawing Sheets

U.S. PATENT DOCUMENTS

| | | | |
|---|---|---|---|
| 4,020,469 | 4/1977 | Manning | 340/172 |
| 4,124,899 | 11/1978 | Birkner | 364/716 |
| 4,417,245 | 11/1983 | Melas et al. | 340/825.8 |
| 4,609,986 | 9/1986 | Hartmann et al. | 364/200 |
| 4,617,479 | 10/1986 | Hartmann et al. . | |
| 4,642,487 | 2/1987 | Carter . | |
| 4,677,318 | 6/1987 | Veenstra et al. . | |
| 4,706,216 | 11/1987 | Carter | 365/94 |
| 4,713,792 | 12/1987 | Hartmann et al. | 364/900 |
| 4,717,912 | 1/1988 | Harvey | 340/825.8 |
| 4,823,278 | 4/1989 | Kikuchi et al. | 364/491 |
| 4,864,161 | 9/1989 | Norman et al. . | |
| 4,871,930 | 10/1989 | Wong et al. . | |
| 4,899,067 | 2/1990 | So et al. . | |
| 4,912,342 | 3/1990 | Wong et al. . | |
| 5,036,473 | 7/1991 | Butts | 364/489 |
| 5,109,353 | 4/1992 | Sample et al. . | |
| 5,121,006 | 6/1992 | Pedersen et al. . | |
| 5,155,858 | 10/1992 | DeBruler et al. | 395/800 |
| 5,179,551 | 1/1993 | Turner | 370/60 |
| 5,241,224 | 8/1993 | Pedersen et al. . | |
| 5,258,668 | 11/1993 | Cliff et al. . | |
| 5,260,610 | 11/1993 | Pedersen et al. . | |
| 5,260,611 | 11/1993 | Cliff et al. . | |
| 5,274,581 | 12/1993 | Cliff et al. . | |
| 5,276,425 | 1/1994 | Swanson et al. | 340/826 |
| 5,329,470 | 7/1994 | Sample et al. . | |
| 5,336,950 | 8/1994 | Popli et al. . | |
| 5,350,954 | 9/1994 | Patel et al. . | |
| 5,352,123 | 10/1994 | Sample et al. . | |
| 5,359,242 | 10/1994 | Veenstra . | |
| 5,436,575 | 7/1995 | Pedersen et al. . | |
| 5,448,496 | 9/1995 | Butts et al. | 364/489 |
| 5,452,231 | 9/1995 | Butts et al. | 364/489 |
| 5,452,239 | 9/1995 | Dai et al. . | |
| 5,477,475 | 12/1995 | Sample et al. . | |
| 5,495,476 | 2/1996 | Kumar | 370/54 |
| 5,574,388 | * 11/1996 | Barbier et al. | 326/41 |
| 5,598,318 | 1/1997 | Dewitt et al. | 361/683 |
| 5,612,891 | 3/1997 | Butts et al. . | |
| 5,644,515 | 7/1997 | Sample et al. . | |
| 5,657,241 | 8/1997 | Butts et al. . | |
| 5,661,662 | 8/1997 | Butts et al. . | |
| 5,777,489 | * 7/1998 | Barbier et al. | 326/40 |
| 6,181,162 | * 1/2001 | Lytle et al. | 326/41 |
| 6,184,706 | * 2/2001 | Heile | 326/39 |
| B1 4,617,479 | 9/1993 | Hartmann et al. . | |

OTHER PUBLICATIONS

"MAX 7000," Altera Data Book, Chapter 5, pp. 153–215.

Minnick, Survey of Microcellular Research, Journal of ACM, Apr. 1967.

Nichols, A Logical Next Step for Read–Only Memories, Electronics, Jun. 1967.

Wahlstrom, Programmable Logic Arrays—Cheaper by The Millions, Electronics, Dec. 1967.

Shoup, Programmable Cellular Logic Arrays, Carnegie Mellon Ph.D. Thesis, Mar. 1970.

Fleisher, The Writeable Personalized Chip, Computer Design, Jun. 1970.

Mukhopadhyay, Recent Developments in Switching Theory, Academic Press, 1970.

Heutink, Implications of Busing for Cellular Arrays, Computer Design, Nov. 1974.

AT&T Microelec. Advance Data Sheet, Optimized Reconfigurable Cell Array (ORCA) Series Field–Programmable Gate Arrays, Feb. 1993.

Benes, V.E., Mathematical Theory of Connecting Networks and Telephone Traffic, Chapter 3: Rearrangeable Networks, Academic Press, Inc., 1965, pp. 82–135.

* cited by examiner

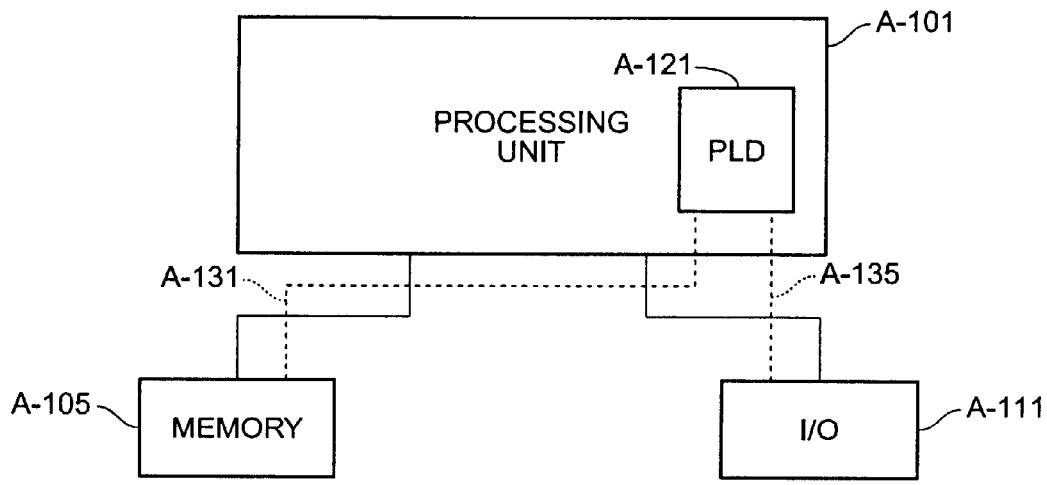
FIG. A-1
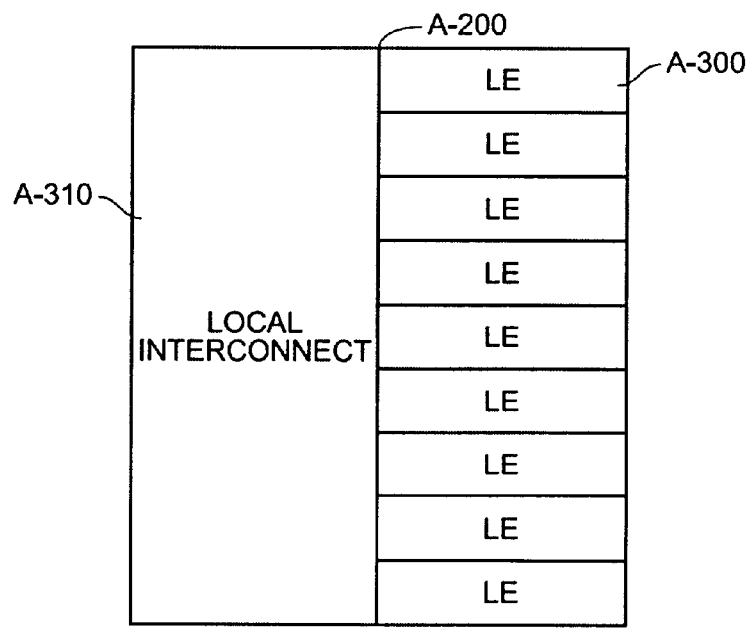
FIG. A-3

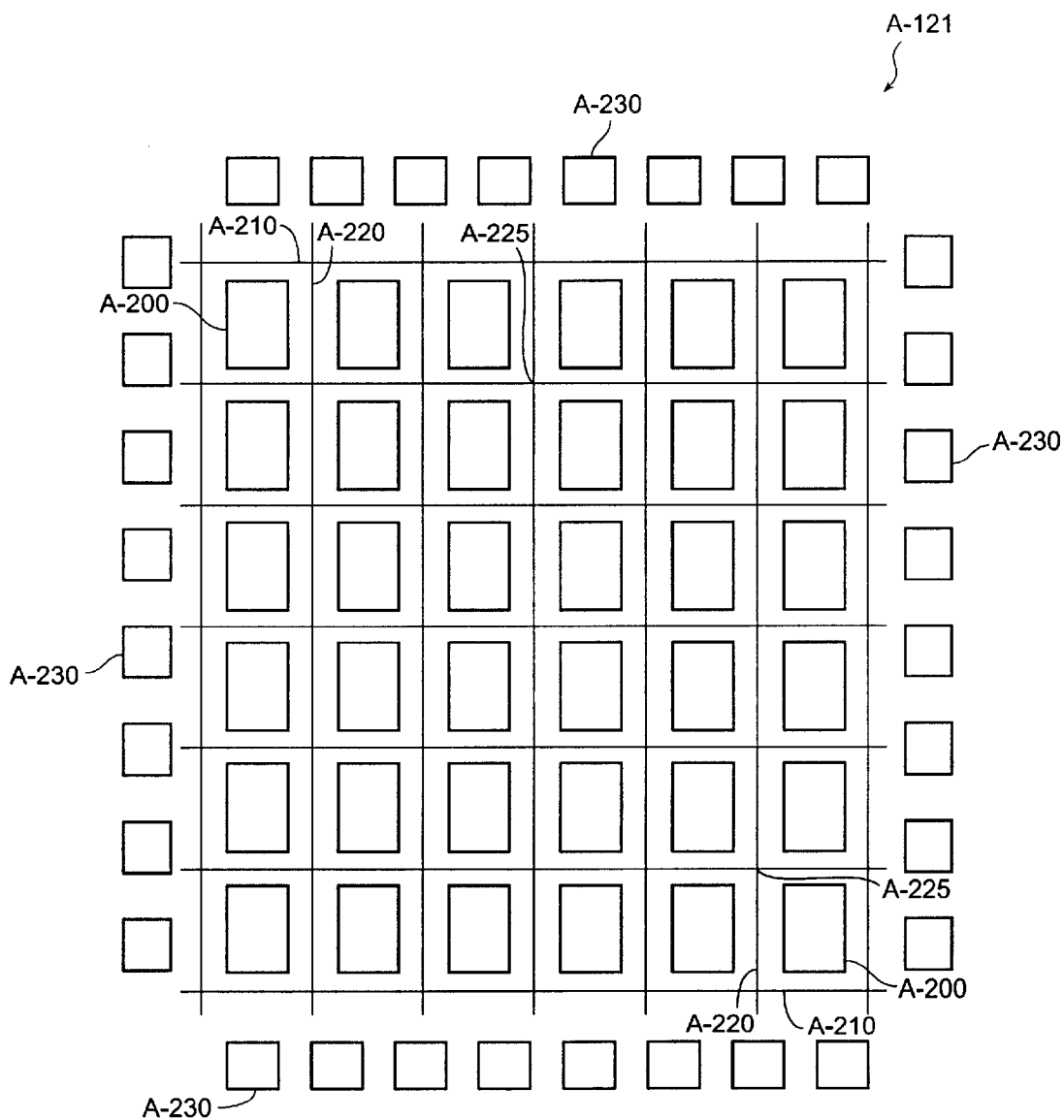
FIG. A-2

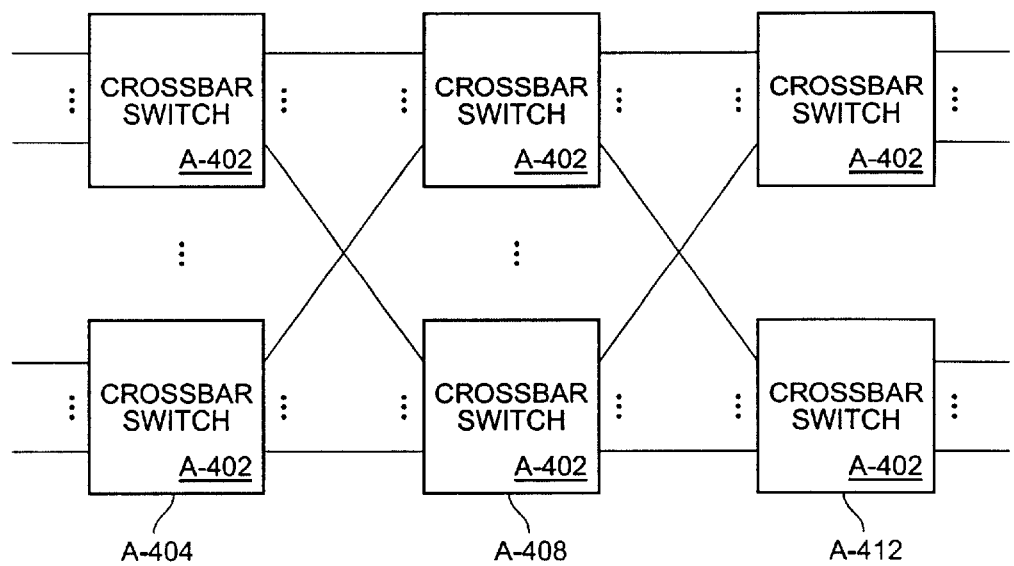
*FIG. A-4*
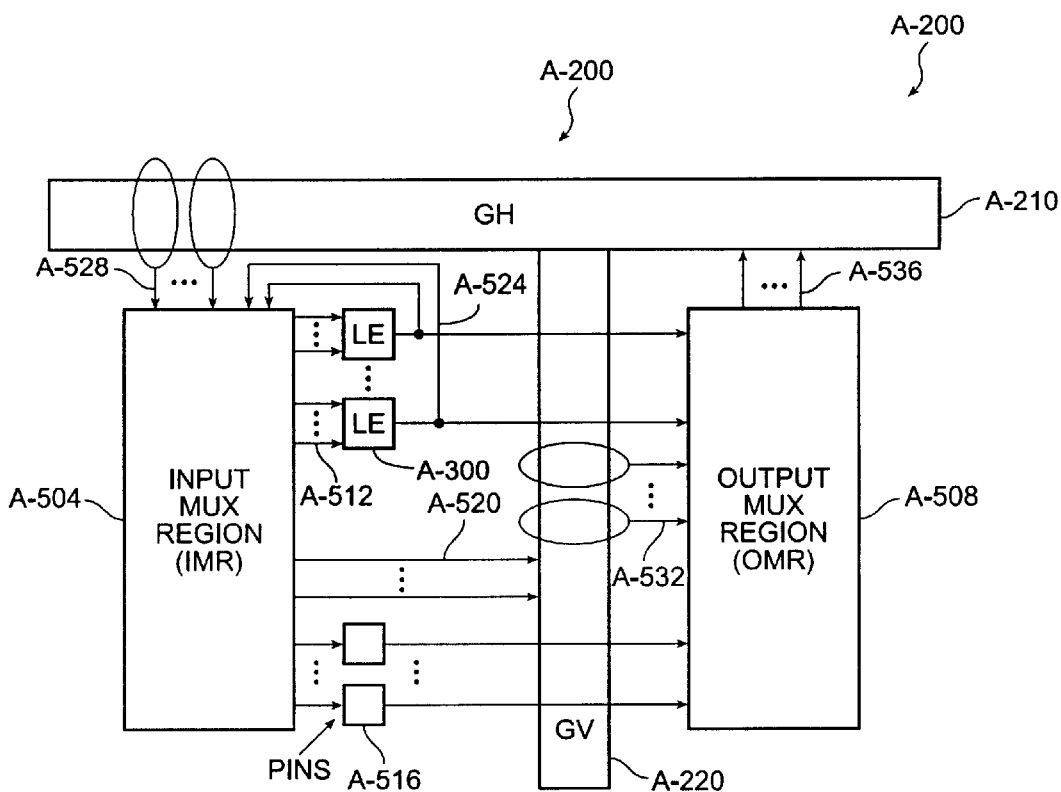
*FIG. A-5*

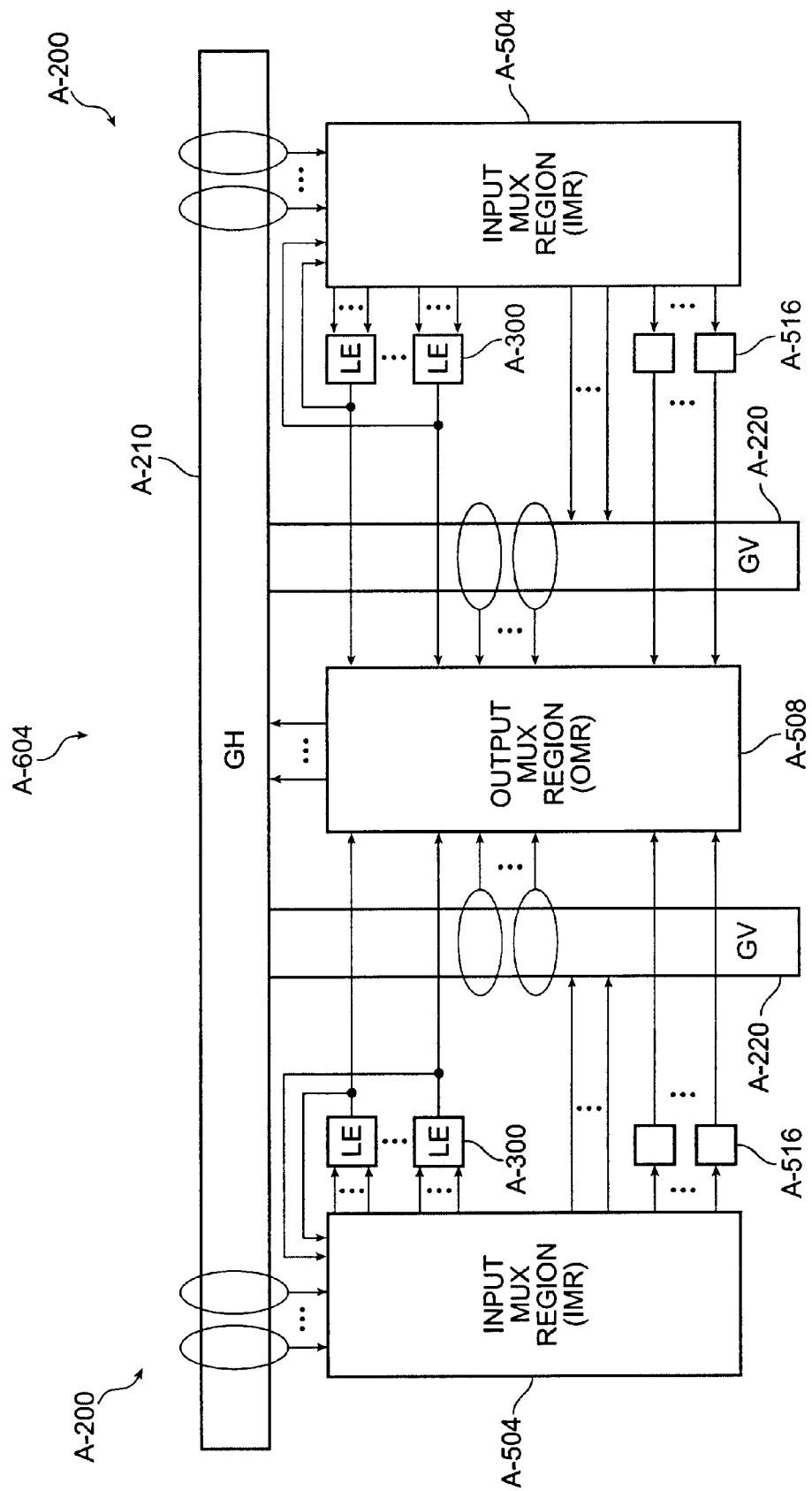
FIG. A-6

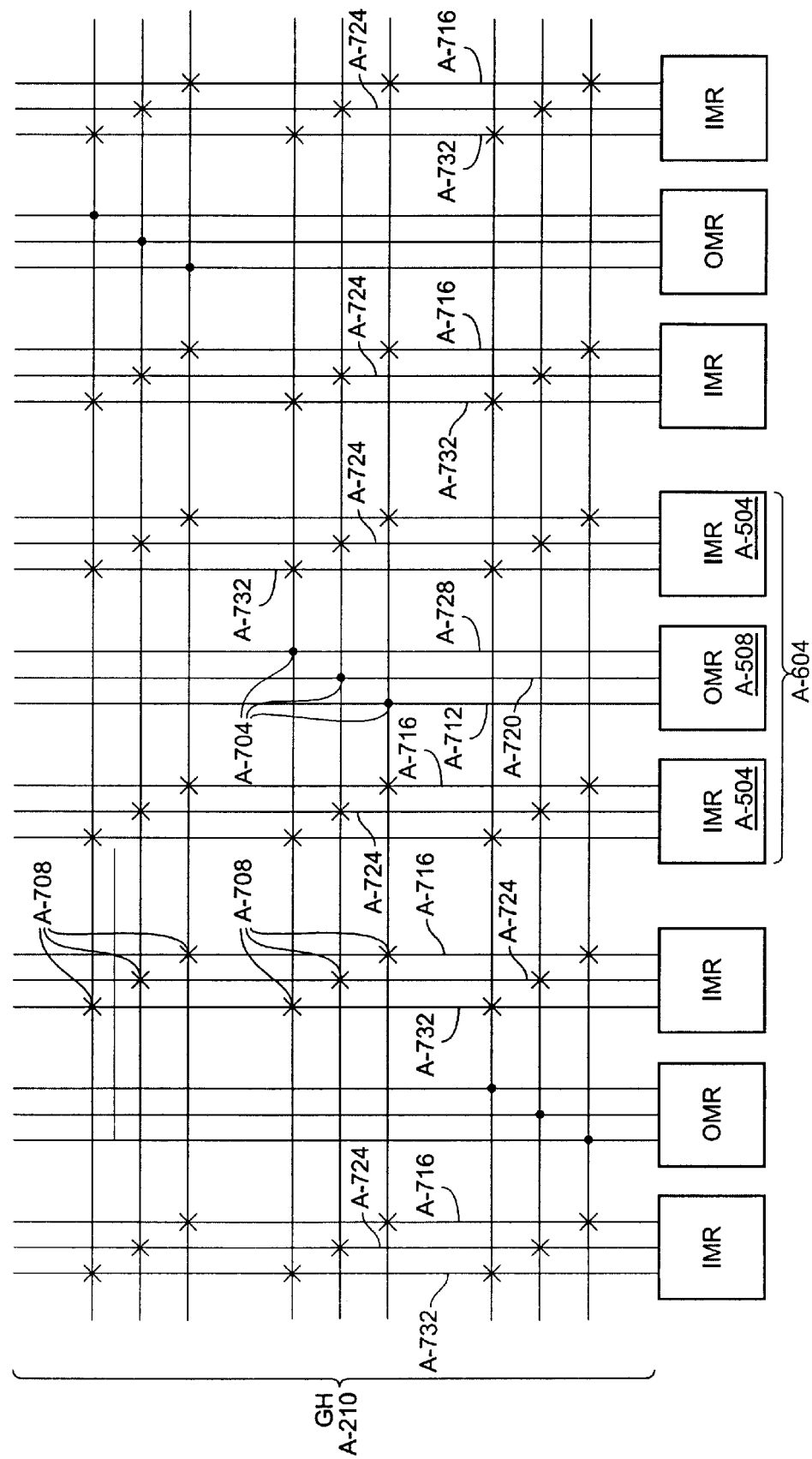
FIG. A-7

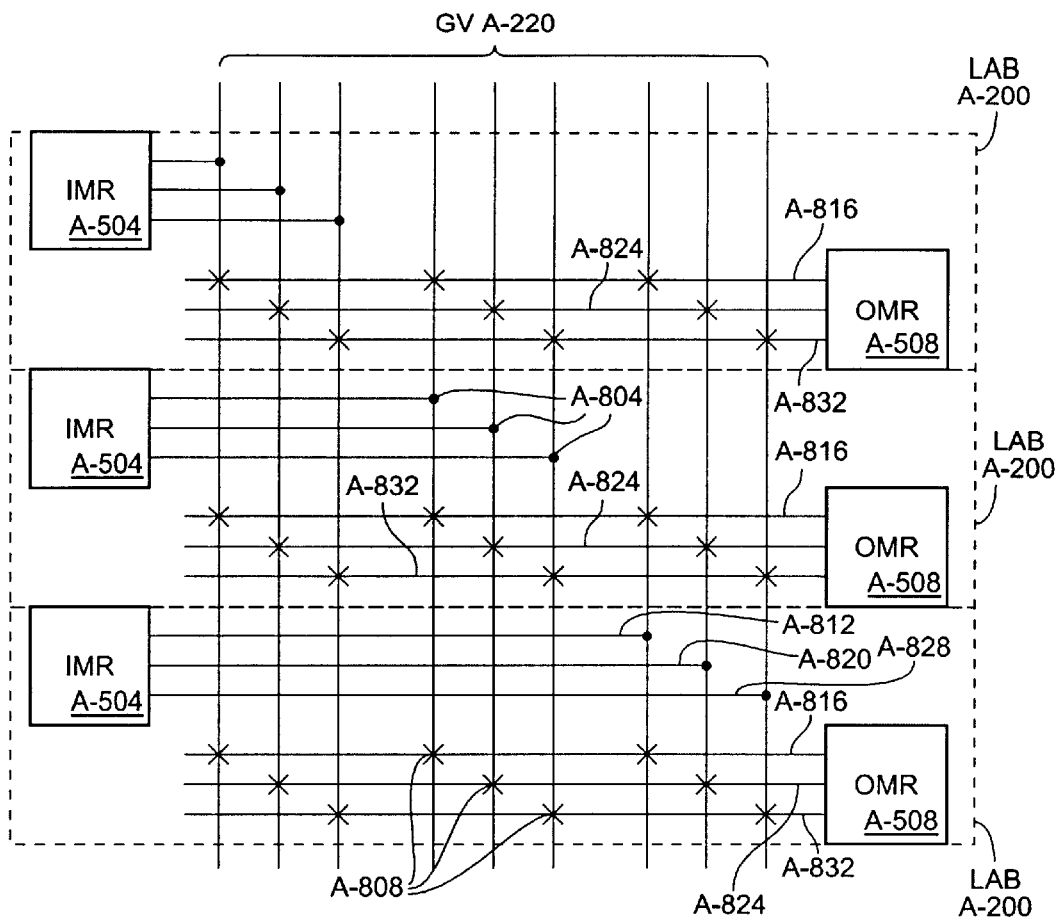
FIG. A-8
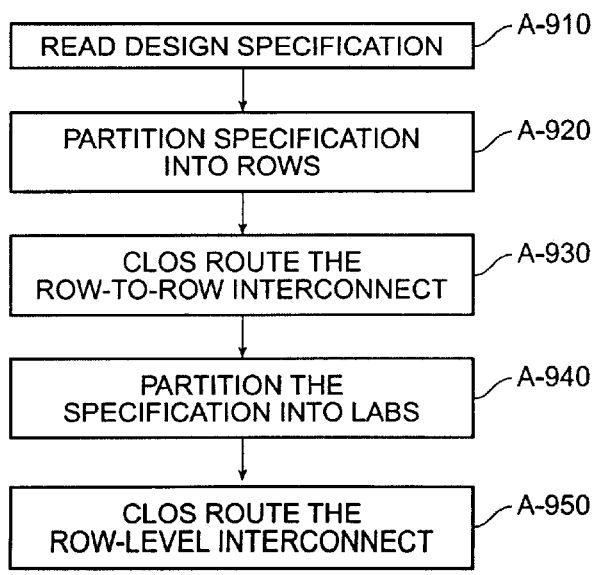
FIG. A-9

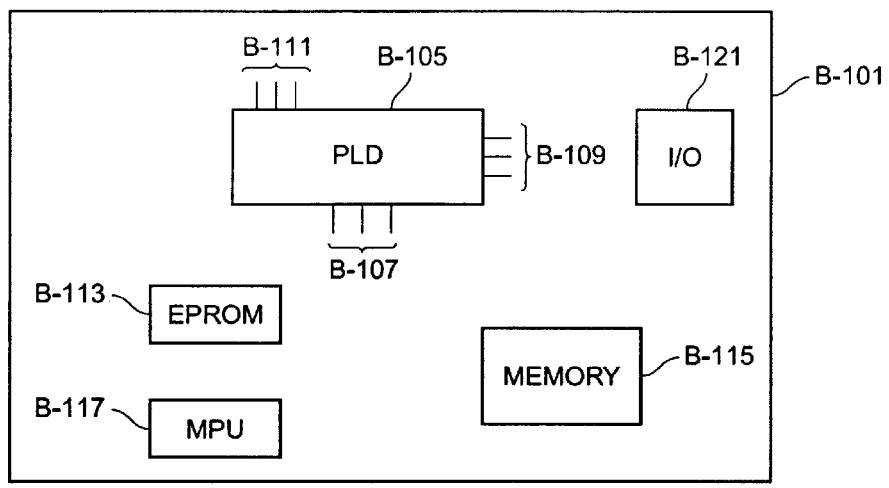
FIG. B-1
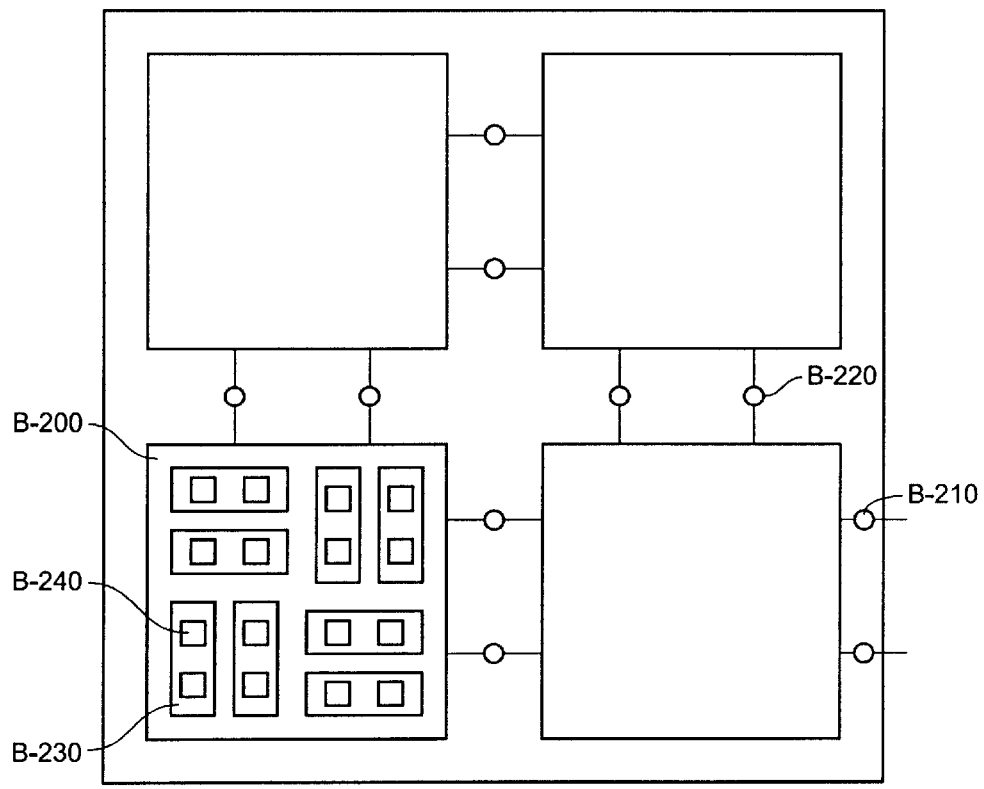
FIG. B-2

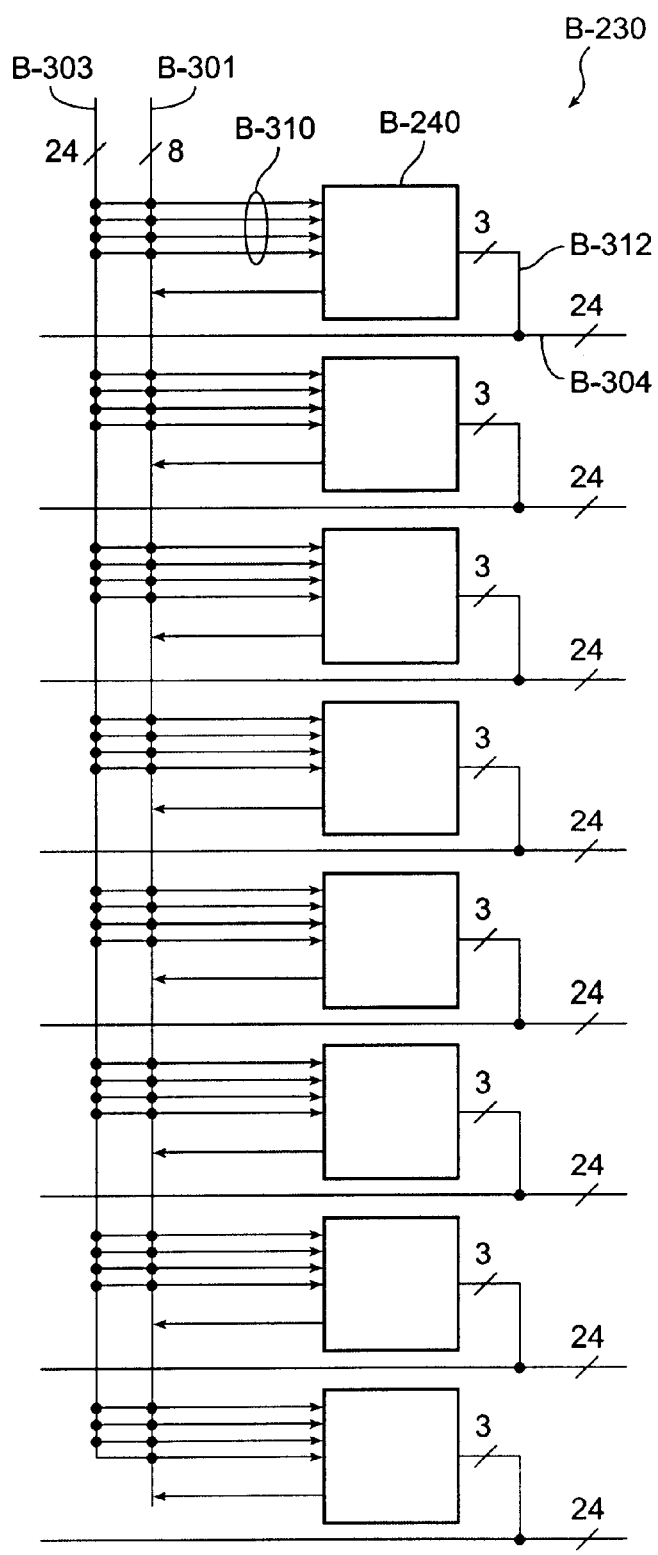
FIG. B-3A

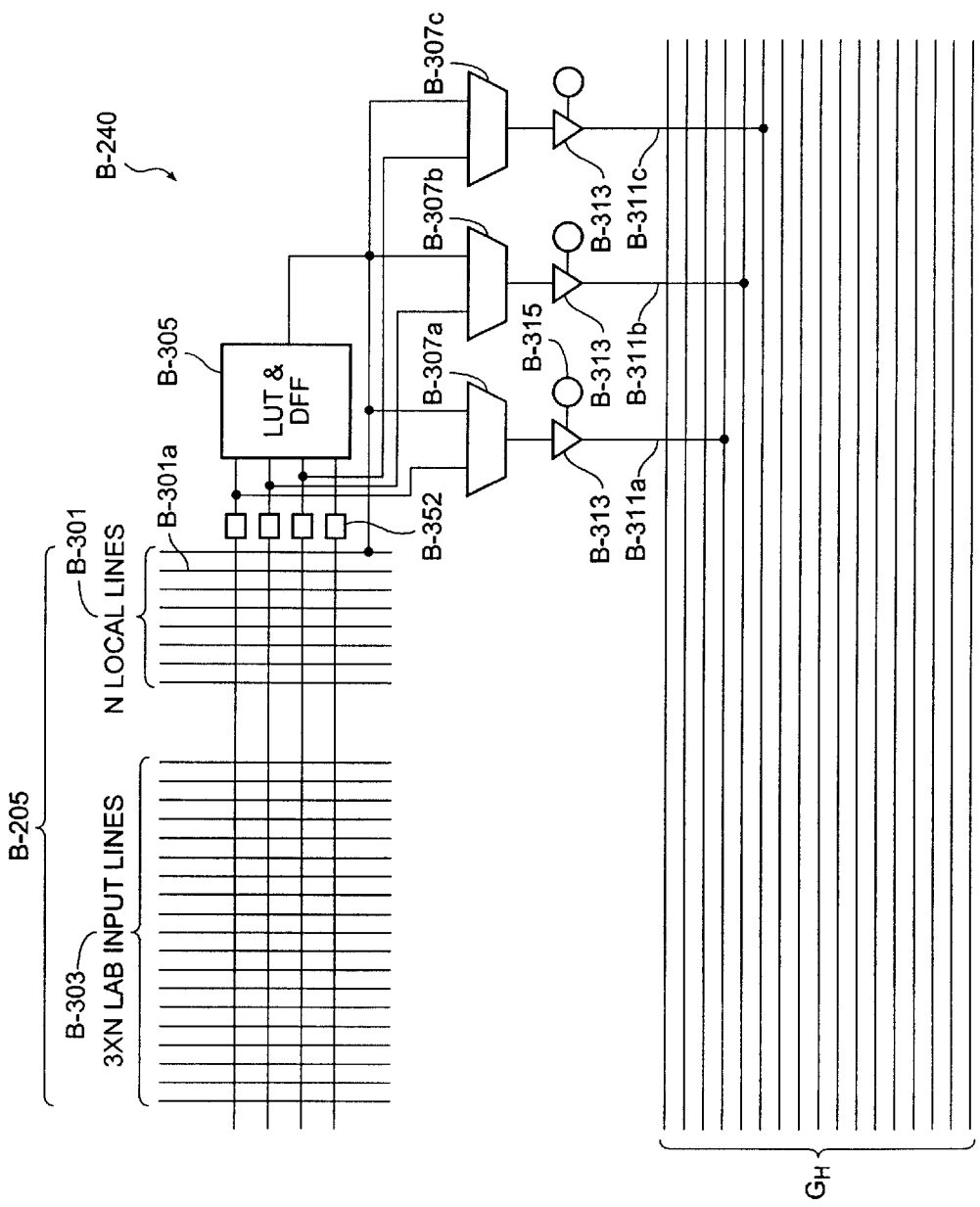
FIG. B-3B

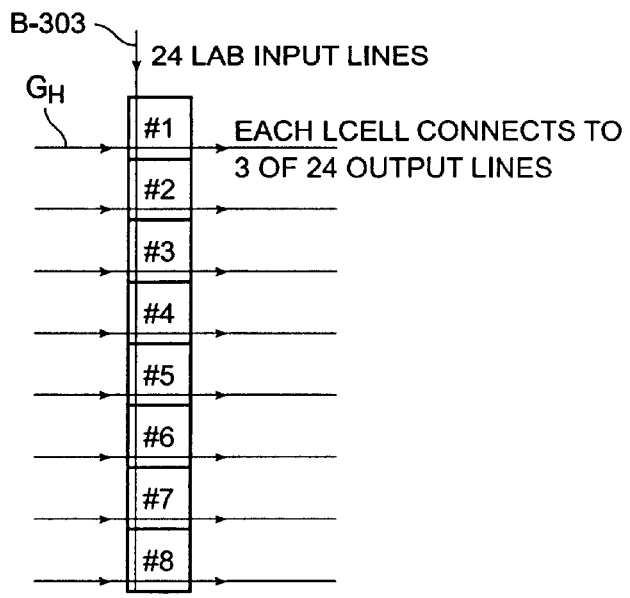
FIG. B-4
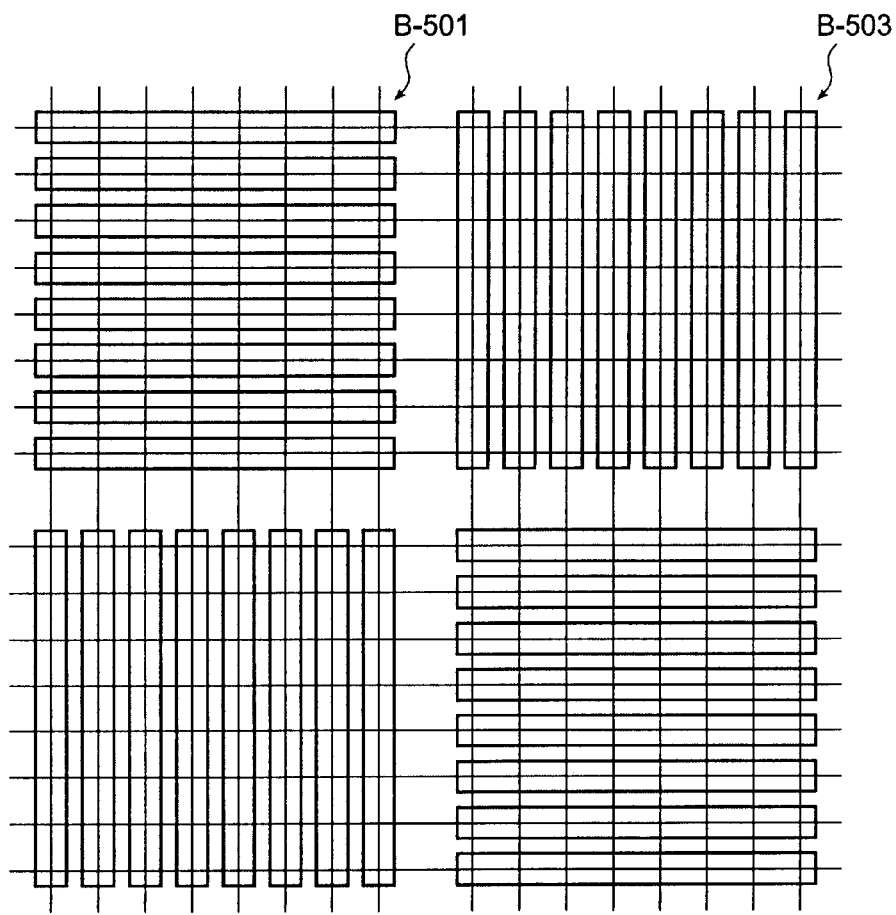
FIG. B-5

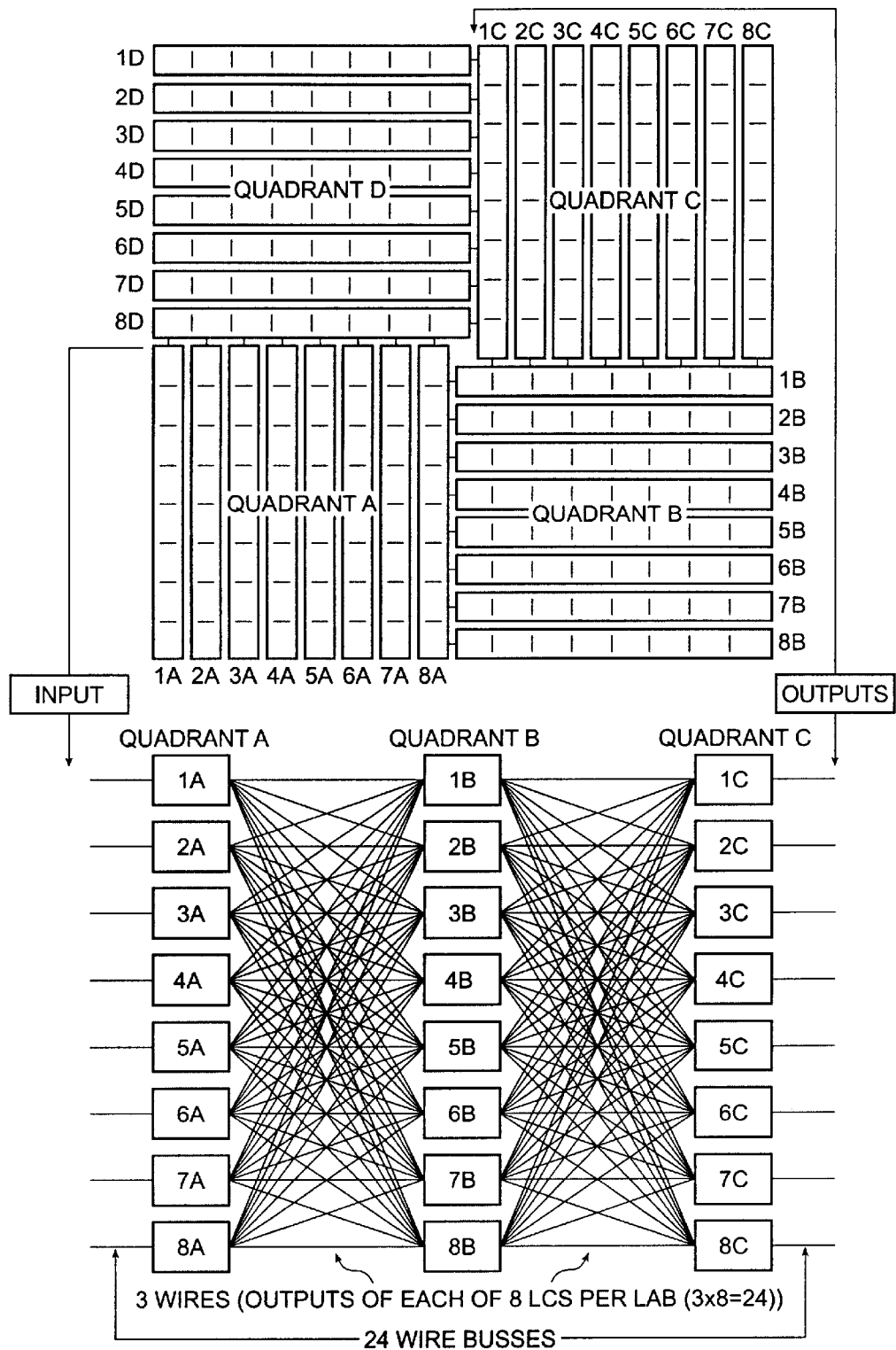
FIG. B-6

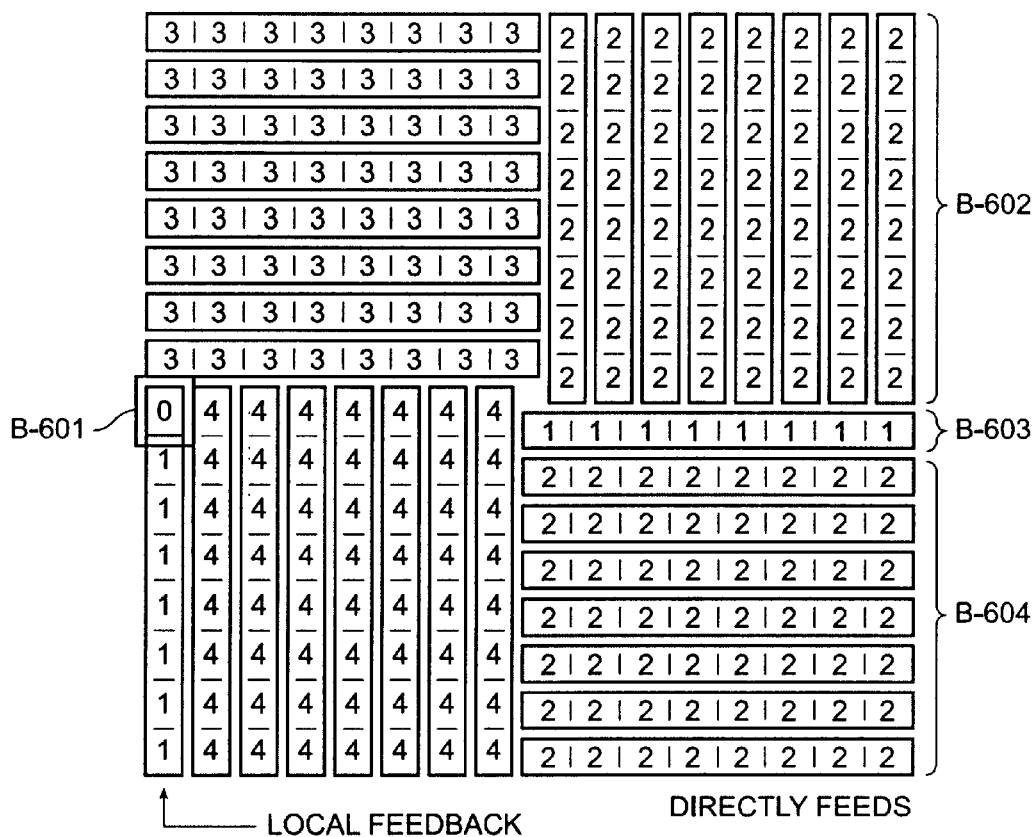
FIG. B-7

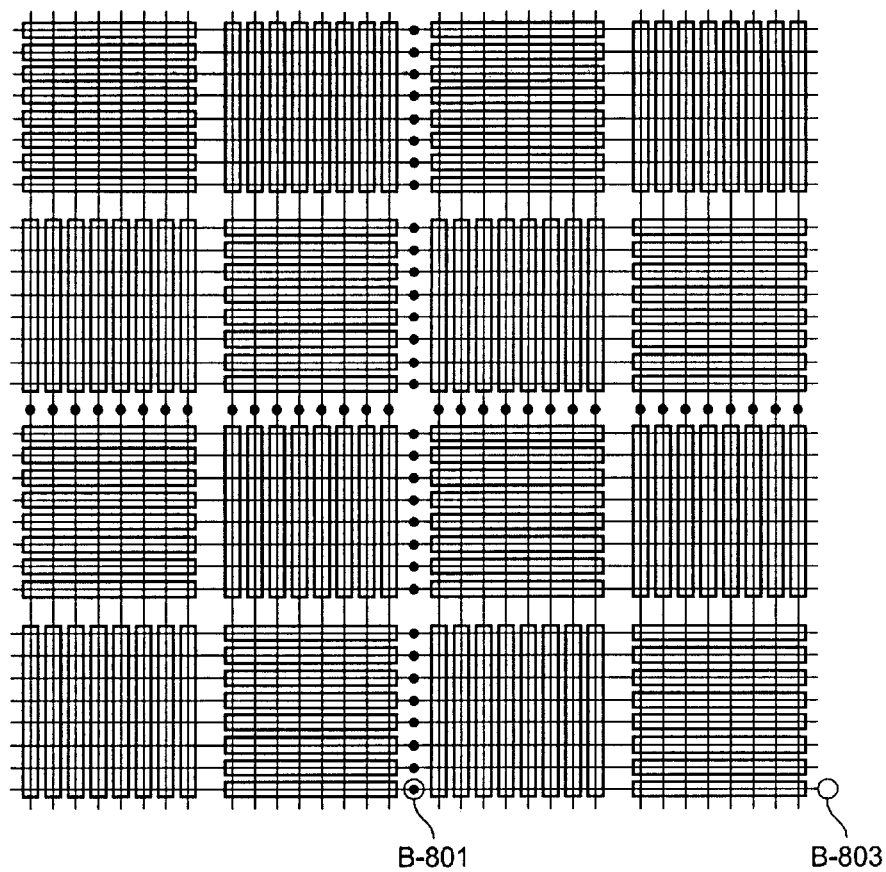
*FIG. B-8A*
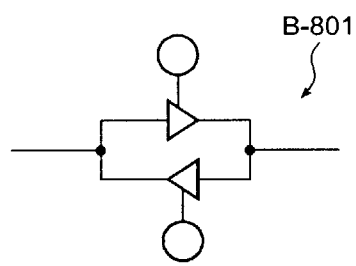
*FIG. B-8B*
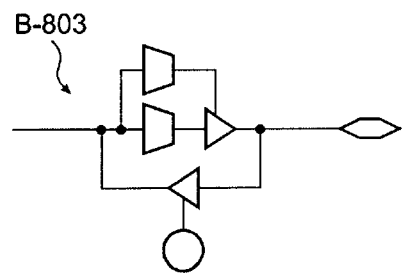
*FIG. B-8C*

PROGRAMMABLE LOGIC DEVICE WITH HIGHLY ROUTABLE INTERCONNECT

This application claims the benefit of U.S. Provisional Application No. 60/014,942, filed Apr. 5, 1996, incorporated herein by reference, and U.S. Provisional Application No. 60/015,122, filed Apr. 10, 1996, incorporated herein by reference.

BACKGROUND OF THE INVENTION

The present invention relates to the field of programmable logic integrated circuits. More specifically, the present invention provides an enhanced programmable logic architecture, improving upon the composition, configuration, and arrangements of logic array blocks and logic elements and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, MAX® 5000, MAX® 7000, FLEX® 8000, and FLEX® 10K families of devices made by Altera Corp.

PLDs are generally known in which many logic array blocks (LABs) are provided in a two-dimensional array. Further, PLDs have an array of intersecting signal conductors for programmably selecting and conducting logic signals to, from, and between the logic array blocks. LABs contain a number of relatively elementary logic individual programmable logic elements (LEs) which provide relatively elementary logic gates such as NAND, NOR, and exclusive OR gates.

Resulting from the continued scaling and shrinking of semiconductor device geometries, which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. In particular, it is important to provide enough interconnection resources between the programmable logic elements so that the capabilities of the logical elements can be fully utilized and so that complex logic functions (e.g., requiring the combination of multiple LABs and LEs) can be performed, without providing so much interconnection resources that there is a wasteful excess of this type of resource.

While such devices have met with substantial success, such devices also meet with certain limitations, especially in situations in which the provision of additional or alternative types of interconnections between the logic modules would have benefits sufficient to justify the additional circuitry and programming complexity. Such additional interconnection paths may be desirable for making frequently needed kinds of interconnections, for speeding certain kinds of interconnections, for allowing short distance connections to be made without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

As can be seen, an improved programmable logic array integrated circuit architecture is needed, especially an architecture providing additional possibilities for interconnections between the logic modules and improved techniques for organizing and interconnecting the programmable logic elements, including LABs and LEs.

The present invention relates generally to the field of integrated circuits and their operation. More specifically, in one embodiment, the invention provides an improved logic device and method of its operation.

Logic devices and their methods of operation are well known to those of skill in the art. In particular, programmable logic devices have found wide application as a result of their combined low up front cost and versatility to the user.

Altera's FLEX® and MAX® lines of programmable logic devices are among the most advanced and successful programmable logic devices in the industry. In the FLEX® logic devices, a large matrix of logic elements is utilized. In a current commercial embodiment of such devices, each logic element includes a 4-input look-up table for performance of combinational logic and a register that provides for synchronous logic operation.

The logic elements are arranged in groups of, for example, eight logic elements to form larger logic array blocks (LABs). The LABs contain, among other things, a local interconnection structure. The local interconnections allow the outputs of the logic elements to be efficiently routed to other logic elements within a LAB. The various LABs are arranged on the device in a two dimensional array. The various LABs may be connected to each other and to pins of the device though continuous lines that run the entire length and width of the device.

The FLEX® logic devices have met with substantial success and are considered pioneering in the area of programmable logic. While pioneering in the industry, certain limitations still remain. For example, it would be desirable to further increase the flexibility of the user and CAD software to program the device. In the presently available configurations, a particular signal may be blocked. That is, the signal cannot be routed out of an logic element or LAB because a path is not available. It is desirable to create a configuration in which blocked signals are minimized.

From the above, it is apparent that an improved logic device and method of its operation is desirable.

SUMMARY OF THE INVENTION

The present invention is a programmable logic device architecture with a highly routable programmable interconnect structure. The arrangement of the logic array blocks (LABs), programmable interconnect structure, and other logical elements forms a Clos network. In one embodiment, the present invention implements a three-stage Clos network.

After specific constraints have been met, the architecture is guaranteed to route. The architecture is provably routable when there is no fan-out in the middle stage. Provable routability refers to a condition where it has been mathematically shown, as long as certain constraints have been satisfied, that a signal at any input at the first stage may be routed to any output at the third stage.

A LAB of the present invention comprises an input multiplexer region (IMR), logic elements, input-output pins, and output multiplexer region (OMR). The PLD of the present invention implements a Clos network in the directions of the programmable global horizontal interconnect (row) and programmable global vertical interconnect (column).

More specifically, for the row interconnect, the OMR implements a full crossbar switch for the first stage of a Clos network. Multiplexers in a programmable global horizontal interconnect form a second stage. And, the IMR implements a full crossbar switch for a third stage of a Clos network. For the column interconnect, the IMR implements a first stage of a Clos network. Multiplexers in the programmable global vertical interconnect form a second stage. And, the OMR forms a third stage of a Clos network.

In accordance with the teachings of the present invention, a logic array block for a programmable logic device is disclosed, which includes: a plurality of logic elements, where the logic elements are programmably configurable to implement logical functions; an input multiplexer region, which programmably couples a plurality of global horizontal conductors to inputs of the logic elements; and an output multiplexer region, which programmably couples outputs of the logic elements to the plurality of global horizontal conductors.

Other objects, features, and advantages of the present invention will become apparent upon consideration of the following detailed description and the accompanying drawings, in which like reference designations represent like features throughout the figures.

An improved logic device and method of operation is provided by virtue of the present invention. An aspect of the invention provides an improved logic element. The improved logic element performs routing functions as well as logic functions. Input signals of a logic element may be routed to one or more outputs of the logic element directly or after being operated upon by a logic function block.

In another aspect of the invention, additional routing flexibility is provided in a programmable logic device. The logic elements of a programmable logic device are arranged to form a Clos network. A plurality of logic elements are arranged as a grid with columns and rows. Each column is fed by a set of column input signals, and each row provides a set of row output signal. A number signals for a set of row output signals are provided from each of the logic elements in that row. Therefore, a grid with m rows and m columns, having logic elements with n outputs will have m sets of (m*n) outputs. Each column is provided with (m*n) inputs. The grids are coupled with the row outputs of one grid feeding the column inputs of another grid.

A further understanding of the nature and advantages of the inventions herein may be realized by reference to the remaining portions of the specification and the attached drawings.

BRIEF DESCRIPTION OF THE DRAWINGS

FIG. A-1 is a block diagram of a digital system incorporating a programmable logic device integrated circuit;

FIG. A-2 is a block diagram showing the overall architecture of a programmable logic device;

FIG. A-3 is a simplified block diagram of a logic array block (LAB) of a programmable logic device;

FIG. A-4 is a diagram of a Clos network;

FIG. A-5 is a diagram of a logic array block of the present invention;

FIG. A-6 is a diagram of a logic array block pair of the present invention;

FIG. A-7 is a diagram of the connections of a logic array block pair to the GH interconnect;

FIG. A-8 is a diagram of the connections of a logic array block to the GV interconnect;

FIG. A-9 is a flow diagram of a procedure for programming a programmable logic device of the present invention;

FIG. B-1 is an illustration of a system in which the present invention will find application;

FIG. B-2 is a block diagram of a programmable logic device according to one aspect of the invention;

FIG. B-3a is an illustration of a logic array block of the present invention;

FIG. B-3b illustrates a logic element that may be used in a LAB according to one embodiment of the invention;

FIG. B-4 illustrates the floorplan of a LAB showing the possible inputs and outputs to the LAB according to one aspect of the invention;

FIG. B-5 illustrates a 256 logic cell device;

FIG. B-6 illustrates the correspondence of the present invention to a Clos routing network;

FIG. B-7 illustrates the number of delays needed to route to all other logic elements according to one embodiment of the present invention; and FIGS. B-8a, B-8b, and B-8c illustrate a 1024 logic cell device.

DESCRIPTION OF THE PREFERRED EMBODIMENT

FIG. A-1 shows a block diagram of a digital system within which the present invention may be embodied. In the particular embodiment of FIG. A-1, a processing unit A-101 is coupled to a memory A-105 and an I/O A-111 and incorporates a programmable logic device (PLD) A-121. PLD A-121 may be specially coupled to memory A-105 through connection A-131 and to I/O A-111 through connection A-135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD A-121, or a combination of a general purpose computer and auxiliary special purpose hardware.

Processing unit A-101 may direct data to an appropriate system component for processing or storage, execute a program stored in memory A-105 or input using I/O A-111, or other similar function. Processing unit A-101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs A-121 may control the logical operations of the system.

In some embodiments, processing unit A-101 may even be a computer system. In one embodiment, source code may be stored in memory A-105, compiled into machine language, and executed by processing unit A-101. Processing unit A-101 need not contain a CPU and in one embodiment, instructions may be executed by one or more PLDs A-121. Instead of storing source code in memory A-105, only the machine language representation of the source code, without the source code, may be stored in memory A-105 for execution by processing unit A-101. Memory A-105 may be a random access memory (RAM), read only memory (ROM), fixed or flexible disk media, PC Card Flash disk memory, tape, or any other storage retrieval means, or any combination of these storage retrieval means.

Processing unit A-101 uses I/O A-111 to provide an input and output path for user interaction. For example, a user may input logical functions to be programmed into programmable logic device A-121. I/O A-111 may be a keyboard, mouse, track ball, digitizing tablet, text or graphical display, touch screen, pen tablet, printer, or other input or output means, or any combination of these means. In one embodiment, I/O A-111 includes a printer used for printing a hard copy of any processing unit A-101 output. In particular, using I/O A-111, a user may print a copy of a document prepared using a word processing program executed using processing unit A-101. In other cases, a user may print out a copy of the source code or a listing of the logical functions contained within PLD A-121.

PLD A-121 may serve many different purposes within the system in FIG. A-1. PLD A-121 may be a logical building block of processing unit A-101, supporting its internal and external operations. PLD A-121 is programmed to implement the logical functions necessary to carry on its particular role in system operation.

As some examples of the multitude of uses for PLD A-121, processing unit A-101 may use PLD A-121, through connection A-131, to decode memory or port addresses for accessing memory A-105 or I/O A-111. PLD A-121 may be programmed to store data like a memory or specialized memory, where this comes from processing unit A-101 or memory A-105 (via connection A-131). PLD A-121 may be used as a microcontroller for a memory A-105 device such as a fixed or flexible disk drive. PLD A-121 may also be configured to be a microcontroller for an I/O A-111 device such as a keyboard or scanner, passing data through connection A-135.

In other embodiments, PLD A-121 may be used as a controller or specialized processing unit such as a coprocessor for performing mathematical or graphical calculations. In still other embodiments, PLD A-121 may be used for telecommunications applications. For example, processing unit A-101 would direct data to PLD A-121; PLD A-121 processes this data; then PLD A-121 returns the results to processing unit A-101. Furthermore, processing unit A-101 may pass or direct a program stored in memory A-105 or input using I/O A-111 to PLD A-121 for execution. These are some of multitude of uses of PLD A-121 within a digital system. Also, a system such as the one shown in FIG. A-1 may embody a plurality of PLDs A-121, each performing different system functions.

The system shown in FIG. A-1 may also be used for programming PLD A-121 with a particular logic pattern. A computer program for designing functions into a PLD may be stored in memory A-105 and executed using processing unit A-101. Then, a design characteristic which is to be programmed into PLD A-121 is input via I/O A-111 and processed by processing unit A-101. In the end, processing unit A-101 transfers and programs the design characteristic into PLD A-121.

In FIG. A-1, processing unit A-101 is shown incorporating PLD A-121. However, in other embodiments, PLD A-121 may be external to processing unit A-101, and a PLD interface may be coupled between processing unit A-101 and PLD A-121. The PLD interface would provide the proper adapters or sockets for interfacing PLD A-121 to processing unit A-101. Moreover, the PLD interface would provide the proper voltages and electrical characteristics for coupling PLD A-121 to processing unit A-101.

FIG. A-2 is a simplified block diagram of the overall internal architecture and organization of PLD A-121 of FIG. A-1. Many details of PLD architecture, organization, and circuit design are not necessary for an understanding of the present invention and such details are not shown in FIG. A-2.

FIG. A-2 shows a six-by-six two-dimensional array of thirty-six logic array blocks (LABs) A-200. LAB A-200 is a physically grouped set of logical resources that is configured or programmed to perform logical functions. The internal architecture of a LAB will be described in more detail below in connection with FIG. A-3. PLDs may contain any arbitrary number of LABs, more or less than the PLD A-121 shown in FIG. A-2. Generally, in the future, as technology advances and improves, programmable logic devices with even greater numbers of logic array blocks will undoubtedly be created. Furthermore, LABs A-200 need not be organized in a square matrix; for example, the array may be organized in a five-by-seven or a twenty-by-seventy matrix of LABs.

LAB A-200 has inputs and outputs (not shown) which may or may not be programmably connected to a global interconnect structure, comprising an array of global horizontal interconnects (GHs) A-210 and global vertical interconnects (GVs) A-220. Although shown as single lines in FIG. A-2, each GH A-210 and GV A-220 line represents a plurality of signal conductors. The inputs and outputs of LAB A-200 are programmably connectable to an adjacent GH A-210 and an adjacent GV A-220. Utilizing GH A-210 and GV A-220 interconnects, multiple LABs A-200 may be connected and combined to implement larger, more complex logic functions than can be realized using a single LAB A-200.

In one embodiment, GH A-210 and GV A-220 conductors may or may not be programmably connectable at intersections A-225 of these conductors. Moreover, GH A-210 and GV A-220 conductors may make multiple connections to other GH A-210 and GV A-220 conductors. Various GH A-210 and GV A-220 conductors may be programmably connected together to create a signal path from a LAB A-200 at one location on PLD A-121 to another LAB A-200 at another location on PLD A-121. Furthermore, an output signal from one LAB A-200 can be directed into the inputs of one or more LABs A-200. Also, using the global interconnect, signals from a LAB A-200 can be fed back into the same LAB A-200. In other embodiments of the present invention, only selected GH A-210 conductors are programmably connectable to a selection of GV A-220 conductors. Furthermore, in still further embodiments, GH A-210 and GV A-220 conductors may be specifically used for passing signals in a specific direction, such as input or output, but not both.

The PLD architecture in FIG. A-2 further shows at the peripheries of the chip, input-output drivers A-230. Input-output drivers A-230 are for interfacing the PLD to external, off-chip circuitry. FIG. A-2 shows thirty-two input-output drivers A-230; however, a PLD may contain any number of input-output drivers, more or less than the number depicted. Each input-output driver A-230 is configurable for use as an input driver, output driver, or bidirectional driver. An input driver takes signals from outside the chip and interfaces them to on-chip circuitry. An output drive takes internal signals and interfaces them to the outside world. A bidirectional driver performs the functions of both a input driver and an output driver. In addition, a bidirectional drive has a high-impedance mode which allows the driver to interface with a bidirectional bus. In other embodiments of the present invention, a PLD may have dedicated input drivers and dedicated output driver, as well as special "fast" input drivers and the like.

Like LABs A-200, input-output drivers A-230 are programmably connectable to adjacent GH A-210 and GV A-220 conductors. Using GH A-210 and GV A-220 conductors, input-output drivers A-230 are programmably connectable to any LAB A-200. Input-output drivers A-230 facilitate the transfer of data between LABs A-200 and external, off-chip circuitry. For example, off-chip logic signals from other chips may be coupled through input-output drivers A-230 to drive one or more LABs A-200. Based on these off-chip inputs and the logical functions programmed into LABs A-200, LABs A-200 will generate output signals that are coupled through the global interconnect to input-output drivers A-230 for interfacing with off-chip circuitry.

FIG. A-3 shows a simplified block diagram of LAB A-200 of FIG. A-2. LAB A-200 is comprised of a varying number of logic elements (LEs) A-300, sometimes referred to as "logic cells," and a local (or internal) interconnect structure A-310. LAB A-200 has eight LEs A-300, but LAB A-200 may have any number of LEs, more or less than eight. In a further embodiment of the present invention, LAB A-200 has two "banks" of eight LEs for a total of sixteen LEs, where each bank has separate inputs, outputs, control signals, and carry chains.

A more detailed description of LE A-300 of the present invention is given below in connection with FIG. A-4. A general overview is presented here, sufficient to provide a basic understanding of LAB A-200. LE A-300 is the smallest logical building block of a PLD. Signals external to the LAB, such as from GHs A-210 and GVS A-220, are programmably connected to LE A-300 through local interconnect structure 310, although LE A-300 may be implemented in many architectures other than those shown in FIGS. A-1–A-3. In one embodiment, LE A-300 of the present invention incorporates a function generator that is configurable to provide a logical function of a number of variables, such a four-variable boolean operation. As well as combinatorial functions, LE A-300 also provides support for sequential and registered functions using, for example, D flip-flops.

LE A-300 provides combinatorial and registered outputs that are connectable to the GHs A-210 and GVs A-220, outside LAB A-200. Furthermore, the outputs from LE A-300 may be internally fed back into local interconnect structure A-310; through local interconnect structure A-310, an output from one LE A-300 may be programmably connected to the inputs of other LEs A-300, without using the global interconnect structure's GHs A-210 and GVs A-220. Local interconnect structure A-310 allows short-distance interconnection of LEs, without utilizing the limited global resources, GHs A-210 and GVs A-220. Through local interconnect structure A-310 and local feedback, LEs A-300 are programmably connectable to form larger, more complex logical functions than can be realized using a single LE A-300. Furthermore, because of its reduced size and shorter length, local interconnect structure A-310 has reduced parasitics compared to the global interconnection structure. Consequently, local interconnect structure A-310 generally allows signals to propagate faster than through the global interconnect structure.

FIG. A-4 is a diagram of a three-stage Clos network. Only a brief overview of Clos network theory is presented here, sufficient for an understanding of the present invention. A detailed discussion of a Clos network theory is presented in chapter 3 of V. E. Benes, *Mathematical Theory of Connecting Networks and Telephone Traffic* (1965), and is incorporated herein by reference.

In FIG. A-4, the Clos network is comprised of crossbar switches A-402. A crossbar switch A-402 has a plurality of inputs and a plurality of outputs. A crossbar switch A-402 routes its inputs to any of its outputs. A first stage A-404 of crossbar switches A-402 is coupled through a second (or middle) stage A-408 of crossbar switches A-402 to a third stage A-412 of crossbar switches A-402. There are r crossbar switches in the first stage A-404 and third stage A-412. Each crossbar switch A-402 in the first stage has n inputs. Each crossbar switch A-402 in the third stage A-412 has n outputs. There are m crossbar switches A-402 in second stage A-408. An input to a crossbar switch A-402 may be routed to or control multiple outputs of that crossbar; this is referred to as "fan-out."

In a three-stage Clos network, the Clos network provides "provable routability" when there is no fan-out in the middle stage. This condition is expressed mathematically as $m \geq 2n-1$. Provable routability refers to a condition where it has been mathematically shown that a signal at any input at the first stage A-404 may be routed to any output at the third stage A-412. Every output will be coupleable to every input, and vice versa. More specifically, signals coupled to first-stage crossbar switches A-408 will be coupleable to outputs of third-stage crossbar switches A-412 if there is no fan-out in the middle stage.

Essentially, Clos network theory enables the design of switching networks with provable routability, with a minimum of crossbar switches A-402. As applied to programmable logic, Clos network theory provides a technique for minimizing the interconnect and other resources, but still permitting substantial routability and utilization of those resources. Therefore, Clos network theory enables the design of architectures with substantially a minimum of interconnect resources and other resources, but still allowing substantial routability. Furthermore, taking into consideration Clos network theory, the programming of programmable logic integrated circuits is made simpler since signals are provably routable.

Although for provable routability, there should be no fan-out in the middle stage, this can still be useful for PLDs because the first and third stages may be used for the fan-out of signals.

FIG. A-5 is a diagram of LAB A-200 of the present invention. This embodiment of LAB A-200 uses a Clos network as a basic routing structure. Many details of PLD architecture, organization, and circuit design are not necessary for an understanding of the present invention and such details are not shown in FIG. A-5. In order to implement a Clos network, LAB A-200 has an input multiplexer region (IMR) A-504 and an output multiplexer region (OMR) A-508. A Clos network is implemented for LABs A-200 in the GH A-210 direction (a row direction) and the GV A-220 direction (a column direction). In the row direction, OMR A-508 is a first stage of a Clos network; GH A-210 is a middle stage; and IMR A-504 is a third stage. In the column direction, IMR A-504 is a first stage of a Clos network; GV A-220 is a middle stage; and OMR A-508 is a third stage.

IMR A-504 and OMR A-508 are programmable interconnect regions. IMR A-504 programmably routes and couples signals from the outputs of LEs A-300 (via conductors A-524) and from GHs A-210 (via conductors A-528). IMR A-504 programmably couples these signals to the inputs of LEs A-300 (via conductors A-512), input-output pins A-516, and GVs A-220 (via conductors A-520). For example, a signal from other LABs A-200 may be coupled through GH A-210 and IMR A-504 to LEs A-300 of this LAB. In this fashion, a plurality of LABs and LEs may be combined to form more complex logical functions. Furthermore, via IMR A-504, signals from GH A-210 and the outputs of LEs A-300 may be programmably coupled to GV A-220. Also, outputs from LEs A-300 may be fed back into IMR A-504 to programmably couple to the inputs of other LEs A-300 within the same LAB A-200. In this respect, IMR A-504 is similar to local interconnect structure A-310 of FIG. A-3. IMR A-504 allows short-distance interconnection of LEs A-300 within a LAB A-200, without utilizing the limited global resources, such as GHs A-210 and GVs A-220.

Moreover, IMR A-508 also permits driving input-output pins A-516 directly. Input-output pins A-516 are used to communicate signals to and from sources external to the PLD. To drive circuits external to the integrated circuit, the LAB A-200 of the present invention does not require using global interconnection resources to programmably couple signals to input-output drivers A-230 (as shown in FIG. A-2). Outputs of LEs A-300 may be programmably coupled through IMR A-504 to input-output pins A-516 directly without utilizing the global resources.

GHs A-210 may be coupled to IMR A-504 via fully, half-, or partially populated multiplexing. In a fully populated multiplexing scheme, all GHs A-210 may be programmably coupled to IMR A-504. In a half-populated multiplexing scheme, a selected half of the GHs A-210 may be programmably coupled to IMR A-504. Partially populated to multiplexing allows selected GHs A-210 to be programmably coupled to IMR A-504. For example, in one embodiment, only a selected three GHs A-210 out of five may be programmably coupled to IMR A-504. Half- and partially populated multiplexing require fewer programmable connections than fully populated multiplexing. Therefore, half- and partially populated multiplexing result in reduced integrated circuit die sizes. In a specific embodiment, GHs A-210 are coupled to IMR A-504 through fully populated multiplexing.

OMR A-508 programmably routes and couples signals from the outputs of LEs A-300 (via conductors A-524), input-output pins A-516, and GVs A-220 (via conductors A-532). OMR A-508 programmably couples these signals to GHs A-210 (via conductors A-536). For example, via OMR A-508, the outputs of LEs A-300 may be programmably coupled to GHs A-210. Via OMR A-508 and GHs A-210, one LAB may be programmably coupled to other LABs to create more complex logic functions. Also, input-output pins A-516 may be programmably coupled through OMR A-508 to GHs A-210 for routing elsewhere on the integrated circuit. Consequently, input-output pins A-516 may drive LABs A-200 directly without utilizing input-output drivers A-230 (shown in FIG. A-2).

Signals from GVs A-220 may be programmably coupled through OMR A-508 to GHs A-210. GVs A-220 may be coupled to OMR A-508 via fully, half-, or partially populated multiplexing. In a fully populated multiplexing scheme, all GVs A-220 may be programmably coupled to OMR A-508. In a half-populated multiplexing scheme, a selected half of the GVs A-220 may be programmably coupled to OMR A-508. Partially populated multiplexing allows selected GVs A-220 to be programmably coupled to OMR A-508. For example, in one embodiment, only a selected three GVs A-220 out of five may be programmably coupled to OMR A-508. Half- and partially populated multiplexing require fewer programmable connections than fully populated multiplexing. Therefore, the use of half- and partially populated multiplexing result in reduced integrated circuit die sizes. In a specific embodiment, GVs A-220 are coupled to OMR A-508 through fully populated multiplexing.

FIG. A-6 is a diagram of a pair of LABs A-200 of the present invention. A LAB A-200 of FIG. A-6 is similar to LAB A-200 of FIG. A-5. However, in a LAB pair of FIG. A-6, one OMR A-508 is shared between two LABs A-200. LABs A-200 of FIG. A-6 share many similarities with FIG. A-5. Furthermore, many of the connections between GHs A-210, GVs A-220, IMRs A-504, OMR A-508, and other components are similar to that described in FIG. A-5 above. This discussion will primarily focus on the differences in FIG. A-6 from what has already been described for FIG A-5.

In FIG. A-6, a single OMR A-508 is shared between two LABs A-200. These two LABs A-200 form a LAB pair A-604. More specifically, from a first LAB A-200, outputs of LE A-300, GVs A-220, and input-output pins A-516 may be programmably coupled through OMR A-508 to GHs A-210. Similarly, from a second LAB A-200, outputs of LE A-300, GVs A-220, and input-output pins A-516 may be programmably coupled through the same OMR A-508 to GHs A-210. Furthermore, GVs A-220 from LABs A-200 may be coupled to OMR A-508 via fully, half-, or partially populated multiplexing (also described above). After OMR A-508 programmably couples signals to GHs A-210, these signals may be, in turn, programmably coupled to other LABs A-200.

The LABs in FIGS. A-5 and A-6 implement a three-stage Clos network. Moreover, the present invention implements a three-stage Clos network in two dimensions, in the direction of GHs A-210 (row direction) and in the direction of GVs A-220 (column direction). In the row direction, OMRs A-508 (from a plurality of LABs A-200 associated with this row) are the first stage of the Clos network. The middle stage of the Clos network is implemented by this row which are used to programmably couple these signals to IMRs A-504. The third stage of the Clos network is implemented by the IMRs A-504 (from a plurality of LABs associated with this GH A-210). A Clos network is also implemented in the column direction. IMRs A-504 are the first stage. GV multiplexers are the second stage. And, OMRs A-508 are the third stage of the Clos network.

The implementation of a Clos network as shown in FIGS. A-5 and A-6 may be considered a superset of a Clos network. In a Clos network, as shown in FIG. A-4, the number of inputs into a crossbar switch A-402 is equal to the number of outputs. In FIGS. A-5 and A-6, this is also the case. However, these implementations also have additional inputs and outputs for LEs A-300 and input-output pins A-516. These provide additional resources providing additional functionality, which is routable using Clos network resources. The implementation in FIGS. A-5 and A-6 provide programmable resources and Clos network routability in a compact structure. This structure facilitates a compact layout for an integrated circuit.

The sources and destinations, which are the inputs and outputs, of the Clos network are the same. In FIGS. A-5 and A-6, the sources of signals are LEs, GVs, and pins and the destinations are also LEs, GVs, and pins. The implementation in FIG. A-6 is useful for easily organizing a structure so that the number of inputs into GH A-210 from OMR A-508 equals the numbers of outputs from GH A-210 into IMRs A-504. GH A-210 in this case represents a second stage of the Clos network. The middle crossbar switch in a Clos network should have equal numbers of inputs and outputs. The structure in FIG. A-6 provides this feature of a Clos network in a flexible, feature-rich form, without unnecessary complexity or resources.

In a specific embodiment of a PLD architecture implementing a Clos network, there are ten rows and thirty-six columns. A LAB A-200 (one of a LAB pair) contains eight LEs A-300, two input-output pins A-516, three IMR A-504 connections to GVs A-220, three connections from GVs A-220 to OMR A-508. In a row, there are 36 LABs and consequently, 432 programmable conductors. IMR A-504 of LAB A-200 is programmably coupled to twenty-four GH conductors. In a column, there are ten LABs A-200. GV A-220 has thirty programmable conductors for programmably coupling to LAB A-200.

FIG. A-7 is a more detailed diagram of the GH A-210 interconnection resources of the present invention. FIG. A-7 illustrates how LAB pairs A-604 are programmably coupled to GH A-210. FIG. A-7 also shows how a LAB A-200 the present invention implements a Clos network along GHs A-210. Many details of PLD architecture, organization, and circuit design are not necessary for an understanding of the present invention and such details are not shown in FIG. A-7.

Three LAB pairs A-604 are shown in FIG. A-7, but in other embodiments, there may be any number of LAB pairs A-604 along a GH A-210. OMR A-508 is directly coupled to three conductors (A-704) in GH A-210. Since there are three OMRs A-508, FIG. A-7 shows nine GH A-210 conductors. In other embodiments, as the number of LABS A-604 increases, the number of GH A-210 increases accordingly. These three conductors may be programmably coupled through programmable connections A-708 to IMRs A-504. For example, a particular OMR A-508 may be coupled to one or more IMRs A-504 via programmable connections A-708. More specifically, the GH A-210 conductors to which an OMR A-508 is coupled (via connections A-704) may be programmably coupled via programmable connections A-708 to the desired IMRs A-504.

Programmable connections A-708 may be implemented using memory cells such as DRAM, SRAM, EPROM, EEPROM, Flash, and antifuses. In a preferred embodiment of the present invention, programmable connections A-708 use SRAM memory. Furthermore, programmable connections A-708 may be implemented by way of programmable multiplexers.

Further, a first output A-712 of OMR A-508 may be programmably coupled via a GH A-210 conductor and programmable connections A-708 to first inputs A-716 of IMRs A-504. Similarly, a second output A-720 of OMR A-508 may be programmably coupled via a GH A-210 conductor and programmable connections A-708 to second inputs A-724 of IMRs A-504. And, a third output A-728 of OMR A-508 may be programmably coupled via a GH A-210 conductor and programmable connections A-708 to third inputs A-732 of IMRs A-504. This is similarly the case for other OMRs A-508 and sets of GHs A-210 along the same GH A-210.

In effect, the first input A-716 to IMR A-504 forms a multiplexer which programmably selects from among the OMR A-508 outputs which may be programmably coupled to first input A-716. The second input A-724 to IMR A-504 also forms a multiplexer which programmably selects from among the OMR A-508 outputs which may be programmably coupled to second input A-724. And, the third input A-732 to an IMR A-504 also forms a multiplexer which programmably selects from among the OMR A-508 outputs which may be programmably coupled to third input A-732. Consequently, GHs A-210 forms GH multiplexers. Outputs from OMR A-508 may be viewed as inputs to these GH multiplexers (or GH multiplexer drivers). Inputs to IMR A-504 may be viewed as outputs from these GH multiplexers.

The present invention implements a Clos network along GH A-210. More specifically, GH A-210 forms a three-stage Clos network. OMRs A-508 are the first stage; the GH multiplexers are the second stage; and IMRs A-504 are the third stage of the Clos network.

FIG. A-8 is a more detailed diagram of the GV A-220 interconnection resources of the present invention. FIG. A-8 illustrates how LABs A-200 are programmably coupled to GV A-220. FIG. A-8 also shows how a the present invention implements a Clos network along GV A-220. Many details of PLD architecture, organization, and circuit design are not necessary for an understanding of the present invention and such details are not shown in FIG. A-8.

Three LABs A-200 are shown in FIG. A-8, but in other embodiments, there may be any number of LABs A-200 along a GV A-210. In a specific embodiment, there are ten LABs A-200 along a GV A-210 of the PLD. IMR A-504 is directly coupled to three conductors via connections A-804 in GV A-210. Since there are three IMRs A-504, FIG. A-8 shows nine GV A-220 conductors. In other embodiments, as the number of LABs A-200 increases, the number of GVs A-220 increases accordingly. These three conductors may be programmably coupled through programmable connections A-808 to IMRs A-504. For example, a particular OMR A-508 may be coupled to one or more OMRs A-508 via programmable connections A-808. More specifically, the GV A-220 conductors to which an IMR A-504 is coupled (via connections A-804) may be programmably coupled via programmable connections A-808 to the desired OMRs A-508.

Programmable connections A-808 may be implemented using memory cells such as DRAM, SRAM, EPROM, EEPROM, Flash, and antifuses. In a preferred embodiment of the present invention, programmable connections A-808 use SRAM memory. Furthermore, programmable connections A-808 may be implemented by way of programmable multiplexers. Via GVs A-220 and the programmable resources described, LABs A-200 may be programmably combined with other LABs A-200 to form more complex logic functions.

Further, a first output A-812 of IMR A-504 may be programmably coupled via a GV A-220 conductor and programmable connections A-808 to first inputs A-816 of OMRs A-508. Similarly; a second output A-820 of IMR A-504 may be programmably coupled via a GV A-220 conductor and programmable connections A-808 to second inputs A-824 of OMRs A-508. And, a third output A-828 of IMR A-504 may be programmably coupled via a GV A-220 conductor and programmable connections A-808 to third inputs A-832 of OMRs A-508. This is similarly the case for other IMRs A-504 along the same GV A-220.

In effect, the first input A-816 to OMR A-508 forms a multiplexer which programmably selects from among the IMR A-504 outputs which may be programmably coupled to first input A-816. The second input A-824 to OMR A-508 also forms a multiplexer which programmably selects from among the IMR A-504 outputs which may be programmably coupled to second input A-824. And, the third input A-832 to an OMR A-504 also forms a multiplexer which programmably selects from among the IMR A-504 outputs which may be programmably coupled to third input A-832. Consequently, outputs from IMR A-504 may be viewed as inputs to GV multiplexers (or GV multiplexer drivers). Inputs to OMR A-508 may be viewed as outputs from these GV multiplexers.

The present invention implements a Clos network along GVs A-220. More specifically, GVs A-220 forms a three-stage Clos network. IMRs A-504 are the first stage; the GV multiplexers are the second stage; and OMRs A-508 are the third stage of the Clos network.

A PLD of the present invention may be programmed according to the procedure shown in the flow diagram in FIG. A-9. The procedure in FIG. A-9 may be performed on a general purpose computer, programmed digital computer, other computing machine specially adapted for programming design characteristics into a programmable logic device. For example, the flow diagram shown in FIG. A-9 may be performed by the system described in FIG. A-1.

A "read design specification" step A-910 reads the specification of the design to be implemented into a programmable logic device. A design specification defines the boolean equations, logical functions, and other operations to be implemented into LEs A-300 of PLD A-121. This specification may have been previously defined by a user and may in part, be generated by a computer or other machine. This specification also includes the assignments for input-output pins A-516. For example, a user may request a particular signal or signals to input or output from designated input-output pins A-516. These requests are referred to as input-output pins A-516 assignments. When programming PLD A-121, these input-output pin A-516 assignments will be taken into consideration.

A "partition specification into rows" step A-920 partitions (divides) the boolean equations, logical functions, and other operations of the design specification among the rows of LABs A-200 of PLD A-121. Partition step A-920 considers the numbers of signals routing into and out of this row. This process will introduce and utilize GV multiplexers and GV drivers when required.

Partition step A-920 ensures provable routability of the column interconnect by dividing functions and operations so that the signals going between rows of LABs satisfies Clos theory constraints. More specifically, the row fan-in must be less than or equal to the total number of inputs of that row and the row fan-out must be less than or equal to the total number of outputs of that row. Fan-out is measured as the total number of rows that are driven by a given row. For example, if a row has 100 output signals, but 2 outputs from that row drive two different rows, then the total fan-out for that row is 102.

As a further example, in the case where a row has thirty-six LABs, each LAB having eight LEs A-300, two input-output pins A-516, three Gv drivers, and three GV multiplexers, the row fan-in must be less to or equal to A-108 and the row fan-out must be less than or equal to A-108.

A "Clos route the row-to-row interconnect" step A-930 routes the interconnect and signals among the rows in PLD A-121. Clos route step A-930 will assign GV multiplexers and GV drivers into specific LABS, when necessary. If clos theory constraints are satisfied during the partition step A-920, Clos route step A-930 is guaranteed to succeed; this means that all signals into and out of a row will be routable.

A "partition the specification into LABs" step A-940 partitions the design specification and LEs A-300 into LABs A-200 for a row. Partition step A-940 divides the boolean equations, logical functions, and other operations, which were previously allocated into rows, among LABs A-200 of that particular row. Partition step A-940 takes into consideration the input-output pin A-516, GV driver, and GV multiplexer assignments made previously.

Partition step A-940 ensures Clos routability of the row interconnect by dividing functions and operations so that the signals traversing between LABs A-200 satisfies Clos theory constraints. More specifically, the LAB fan-in must be less than or equal to the total number of inputs of that LAB A-200, and the LAB fan-out must be less than or equal to the total number of inputs of that LAB A-200. Fan-out is measured by the total number of LABs A-200 that are driven by OMR A-508 of this LAB A-200. For example, if an OMR A-508 has twenty output signals, but two of them need to drive two different LABs, then the total fan out for this OMR is twenty-two.

As a further example, in the case where a row has thirty-six LABs, each LAB having eight LEs A-300, two input-output pins A-516, three GV drivers, and three GV multiplexers, the LAB fan-in must be less to or equal to twenty-four and the row fan-out must be less than or equal to twenty-four. Furthermore, in the case where LABs A-200 share a common OMR A-508 (e.g., a LAB pair A-604), partition step A-940 counts LAB A-200 inputs independently while the LAB outputs are counted in a pair.

A "Clos route the row-level interconnect" step A-950 routes the signals among LABs A-200 in a row. If Clos theory constraints were satisfied in partition step A-940, Clos route step A-950 is guaranteed to succeed; this means that all signals into and out of a LAB of that row will be routable. The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

Logic devices and their operation are well known to those of skill in the art. FIG. B-1 illustrates a system B-101 in which a programmable logic device B-105, made according to the invention described herein, may be incorporated. Programmable logic device B-105 may be used to perform various logic functions in system B-101. Programmable logic devices (sometimes referred to as a PALs, PLAs, FPLAs, PLDs, CPLDs, EPLDs, EEPLDs, LCAs, or FPGAs), are well-know integrated circuits that provide the advantages of fixed integrated circuits with the flexibility of custom integrated circuits. Such devices allow a user to electrically program standard, off-the-shelf devices to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, the Altera Data Book, July 1996, incorporated herein by reference. The latter are described in, for example, U.S. Pat. Nos. 5,258,668, 5,260,610, 5,260,611 and 5,436,575, incorporated herein by reference for all purposes. Programmable logic devices may be used in systems B-101 in a wide variety of applications such as, merely by way of example, telecommunications systems, switches, networks, automotive systems, control systems, consumer electronics, personal computers, and others. Systems B-101 may be provided on a single board, on multiple boards, or even within multiple enclosures. Programmable logic device B-105 may be provided with various inputs on pins B-107 from system B-101, and provide system B-101 with various outputs on pins B-109. Pins B-107 and B-109, in some cases, are programmable as input, output, or input/output pins and are, therefore, interchangeable. Other pins B-111 may also be connected to the system and include, for example, control pins, and power supply pins.

System B-101 may also include other integrated circuits, for example, special purpose integrated circuits, EPROM(s) B-113 for programming the PLD, other memory devices B-115, microprocessor(s) B-117, input/output devices B-121, and other integrated circuits of the type known to those of skill in the art.

FIG. B-2 is an overall block diagram illustrating an embodiment of a programmable logic device B-105 of the present invention. One or more routing networks B-200 are coupled with input/output pins B-210 and possibly with other routing networks B-200 by interconnection circuitry B-220. Each routing network B-200 may comprise a plurality of logic elements B-240. Logic elements B-240 may be grouped into logic array blocks B-230. A logic array block B-230 has a number of logic elements B-240 and a local interconnection scheme (not shown). The local interconnection scheme provides routing of signals among logic elements B-240, within a common logic array block.

Logic elements B-240 provide routing functions and perform logic functions for the programmable logic device. Each logic element B-240 may be capable of performing combinational logic functions on its inputs. For example, logic element B-240 may provide a desired output for each combination of, for example, four inputs. According to one aspect of the invention, logic elements B-240 are formed as look-up tables. They may also include a storage device such as a flip-flop to allow for synchronous-operation. Logic elements B-240 may be combined in groups to form logic array blocks B-230. In this particular example, each logic array block B-230 has two logic elements B-240 for clarity in the figure. In a preferred embodiment, each logic array block B-230 may have eight logic elements B-240. However, any number of logic elements B-240 may be used.

The various logic elements within a routing network B-200 may be interconnected in a particular manner which provides a network known in the industry as a Clos network. More detail regarding the interconnection of the logic elements will be found in the following specification.

FIG. B-3a illustrates a more detailed block diagram of an embodiment of a logic array block B-230 of the present invention. Eight representative logic elements B-240 are shown. Details of logic elements B-240 will be discussed with reference to FIG. B-3b below. A local interconnection B-301 is provided. Local interconnection B-301 provides a path from the outputs of individual logic elements B-240 to the inputs of other logic elements B-240 within the same logic array block B-230. Also provided is a set of column inputs B-303 and a set of row outputs B-304.

Each logic element has a number of logic element inputs B-310. For example, FIG. B-3a shows four logic element inputs B-310, although any number may be provided. Each logic element also provides a number of logic element outputs B-312. In a preferred embodiment, there are three logic element outputs. Again however, any number of logic element outputs B-310 may be provided. The logic element inputs B-310 may be coupled to column input B-303, or to local interconnect B-301. Column inputs B-303 provide connections outside of logic array block B-230. In an embodiment of the present invention, each logic array block has, for example, 24 lines in column input B-303 and eight lines in local interconnect B-301. Each of the four logic element inputs have a connection to each of the 24 lines in column input B-303 and the eight lines in local interconnect B-301. Alternatively, each logic element input may have a connection to a subset of lines in column inputs B-303 and local interconnect B-301.

The outputs of logic elements B-240 are also connected to sets of row outputs B-310. Each logic element B-240 of a particular logic array block B-230 is connected with a different set of row outputs B-310. The output of a given logic element B-240 will provide a subset of the lines for a given set of row outputs B-310. For example, if each logic array block B-230 contains m logic elements B-240 and each logic element B-240 has n outputs, the number of output lines in each set of row outputs B-310 will be given by the equation (m*n). This number may be equivalent to the number of column inputs B-303. In this example, since there are eight logic elements and three outputs for each logic element, there are 24 output lines in each set of row outputs B-310. As will be described in greater detail below, row outputs B-310 of a group of logic array blocks may be coupled to the column inputs B-303 of another group of logic array blocks.

FIG. B-3b schematically illustrates a logic element B-240 in greater detail according to one embodiment of the present invention. Not all lines in the logic element B-240 are shown, nor are all functional circuits. Some elements have been eliminated for the sake of clarity.

Logic element B-240 may include a logic function block B-305. Logic function block B-305 provides a result B-309 based upon its inputs. Logic function block may include, for example, a look-up table or universal logic block. A storage element such as a flip-flop type device may also be included in logic function block B-305. Each look-up table may be a circuit which can be programmed to produce a result B-309 which is any logical function of the input signals applied to the look-up table. In this case, the look-up table has four inputs and one output. Each flip-flop may be a storage device which can be programmed either to store or to simply pass through the output signal of the associated look-up table (see, for example, the circuit shown in Norman et al., U.S. Pat. No. 4,864,161, incorporated herein by reference.) Alternatively, the flip-flop could be a flip-flop with no pass through or bypass capability.

The inputs to the look-up table are provided from column inputs B-303 and local interconnect B-301. Column inputs B-303 may be input interconnections which connect to other areas of a device containing logic element B-240. Similarly, row output B-304 may be an output interconnection to other areas of the device. These lines may be selectively coupled to the look-up table inputs via a programmably controlled programmable logic connector ("PLC") B-352. PLC B-352 may be implemented in any of a wide variety of ways. For example, each PLC B-352 may be a relatively simple programmable connector such as a plurality of switches for connecting any one of several inputs to an output. Alternatively, each PLC B-352 may be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs B-352 are EPROMS, EEPROMs, pass transistors, transmission gates, antifuses, laser fuses, metal optional links, just to name a few.

Each of the four data inputs to each look-up table may be connected to any one (or more) of column inputs B-303 (and/or) any one (or more) of the lines in local interconnect B-301 via PLC B-352. In the depicted, presently preferred embodiment, each PLCs B-352 is a 32-to-1 switch so that any one of the 24 column inputs B-303 or any one of the eight lines of local interconnect B-301 can be connected to each look-up table input.

The result B-309 of logic function block B-305 in each logic element B-240 can be applied to a respective one or more of the lines of local interconnect lines B-301. In a preferred embodiment, local interconnect B-301 serves only the logic modules in the associated logic array block B-230. In other words, conductors in local interconnect B-301 do not extend beyond the associated logic array block B-230. However, in other embodiments this is not a necessary restriction.

The result B-309 of logic function block B-305 is also provided as an input to a number of multiplexers. In this example, three multiplexers B-307a, B-307b, and B-307c are provided. A second input to each of the multiplexers B-307a, B-307b, and B-307c is coupled to the outputs of the PLCs B-352. In this example, a first PLC B-352 output is provided to multiplexer B-307a, a second to multiplexer B-307b, and a third to multiplexer B-307c.

Through this arrangement, it is possible to allow up to the result of the logic function block, or any three signals from the column inputs B-303 and local interconnect B-301 to drive any of the logic element output lines B-311a, B-311b, and B-311c. Tri-state drivers B-313 may optionally be provided to drive long output lines, and may be controllable via function control element (such as SRAM memory cell) B-315. The capability of logic element B-240 to route signals from the column inputs to the logic element outputs, or to perform logic functions on the signals before providing the results to the logic element outputs allows greatly expanded versatility in the programmable logic device. For example, the logic element may now perform logic functions, routing functions, or even both simultaneously.

FIG. B-4 conceptually illustrates the operation of the LAB in greater detail. In this particular embodiment, each of the eight logic elements B-240 in a logic array block B-230 are provided with the capability of performing routing. Fewer logic elements may be provided with this capability in some embodiments. As shown, the 24 column inputs B-303 and the eight lines of local interconnect B-301 are connected to each of the logic elements B-240, and the logic element outputs are connected to three of the 24 lines of each set of output lines. As can be seen, the combined routing and logic capability of the device greatly enhances the versatility of the device since the logic elements may be used not only for logic, but also for routing.

FIG. B-5 illustrates the overall floorplan of a routing network of the present invention with 32 logic array blocks and 256 logic elements. The routing network may be designed with four quadrants. Each quadrant contains eight logic array blocks B-230 of the configuration shown in FIG. B-4. The logic array blocks may be placed side by side, conceptually. The three outputs of a given logic element B-230 are connected to three of the 24 row outputs for the set of row outputs associated with the given logic element B-230. Therefore, with eight logic array blocks, all of the 24 row outputs are connected to a logic element.

The above description is a specific embodiment of the invention and is shown by way of example only. Larger or smaller embodiments may be implemented with a different number of logic elements. Furthermore, there is no need that there be four quadrants, but any number of groups of logic array blocks may be used.

As shown in FIG. B-5, the logic array blocks of adjacent quadrants are arranged in a vertical/horizontal orientation. For example, the logic array blocks of in quadrant B-501 of the device are arranged to run horizontally across the page of FIG. B-5, while the logic array blocks in quadrant B-503 are arranged to run vertically on the page (i.e., the logic elements are arranged in columns in region B-503 that are orthogonal to the columns of logic elements in region B-501.) With this arrangement, the output lines of one quadrant of logic array blocks feed the inputs to the logic array blocks of the adjacent quadrant.

FIG. B-6 illustrates certain advantages of the invention. In particular, the top portion of the figure is another way of depicting the arrangement of FIG. B-5. Each column of logic elements is grouped as a logic array block and represented by the labels 1A, 2A, 1B, etc.

The bottom portion of FIG. B-6 illustrates the connectability of quadrants A, B, and C, as illustrated in the top portion of FIG. B-6. As shown, a signal on any of the column inputs to logic array block 1A is connectable to any of the logic array blocks of quadrant B. This may be done by routing the signal through the logic element in column 1A that is located on the row of the column in quadrant B that is the intended destination. Similarly, the outputs of logic array block 2A may be connected to any of the logic array blocks in quadrant B. Accordingly, it is seen that a high degree of connectability is achieved with minimal routing delay.

In particular, with three groups of logic elements connected in the arrangement shown in FIG. B-6, a network is formed that is known in the art as a Clos network. An advantage of a Clos network is that it is non-blocking. In particular, in the example shown, all of the 8×24 inputs to quadrant A can be connected to the 8×24 outputs of quadrant C without blocking for every possible set of one to one mappings. Other types of networks that are substantially similar to a Clos network may also be achieved with slight modifications to this design.

FIG. B-7 illustrates how a routing network such as that disclosed in the present invention impacts routing delays between logic elements in a typical programmable logic device. The example shown is the B-256 logic element configuration of FIG. B-5. A logic element B-601 is used as a particular example. The remaining logic elements are labeled with a number showing the number of routing delays (i.e., number of transistor delays) between logic element B-601 and the other logic elements in the routing network. This particular example assumes that it is desirable that an output of logic element B-601 feed an input of each of the remaining 255 logic elements in the routing network.

For each logic element in the same logic array block as logic element B-601, there is a single gate delay in a signal transmission from the logic element input from the output of logic element B-601. This is the delay from PLC B-352 shown in FIG. B-3. Similarly, the logic elements in the column B-603, which are horizontally aligned with logic element B-601 will suffer only a single gate delay from PLC B-352 of the corresponding logic element. Logic elements in region B-602 will suffer two gate delays since one of the logic elements in the region B-603 will be used to route the signal into region B-602. Region B-605 also suffers two delays since the other logic elements in the logic array block with logic element B-601 will route the signal to the local interconnect of logic element B-601 another logic element which will route the signal to the logic elements of region B-605. Three gate delays will be experienced as a signal goes from logic element B-601 to logic elements in logic elements in the upper left quadrant of the routing network and four gate delays will be experience in reaching the remaining logic elements in the same quadrant as logic element B-601.

Of course, it will be recognized that modifications to the signal path, such as the addition of other elements or the removal of elements may cause these delays to be different. Such changes do not detract from the spirit of the present invention.

FIG. B-8a illustrates a typical embodiment of a programmable logic device of the present invention with a larger number of logic elements (1024 in this case). This arrangement comprises four of the routing networks described above. The routing networks are arranged in a 2×2 array. As shown, inputs and outputs are stitched together such that each of the four routing networks may communicate with each other. In this case, tri-state drivers B-801 are used to connect each of the lines together and may each be set to drive in either direction or to not drive at all. FIG. B-8b illustrates the circuits B-801 in greater detail. Also shown in FIG. B-8a is a typical I/O block B-803, which is shown in greater detail in FIG. B-8c.

Upon a detailed review of the above, one will recognize that this system provides a Clos network for routing signals throughout the device. In the particular embodiment shown in FIG. B-6, the device is a three stage Clos network. Clos networks theoretically allow any connection between two points in a network to be non-blocked when the fanout is restricted to one. Therefore a signal may be routed to any desired location on the PLD.

The above description is illustrative and not restrictive. Many variations of the invention will become apparent to those of skill in the art upon review of this disclosure. Merely by way of example, the invention has been illustrated primarily with regard to devices using SRAM look-up tables to perform combinational logic functions and specific numbers of logic elements and logic array block. However, the invention is not so limited. The scope of the invention should, therefore, be determined not with reference to the above description, but instead should be determined with reference to the appended claims along with their full scope of equivalents.

What is claimed is:

1. A programmable logic device comprising:
    a plurality of logic elements configurable to implement logical functions;
    an input multiplexer region coupled to said plurality of logic elements, a first global interconnect line, and a second global interconnect line; and
    an output multiplexer region coupled to said plurality of logic elements, said first global interconnect line, and said second global interconnect line,
    wherein said output multiplexer region, said first global interconnect line, and said input multiplexer region implement a first three-stage Clos network, and
    wherein said input multiplexer region, said second global interconnect line, and said output multiplexer region implement a second three-stage Clos network.

2. The programmable logic device of claim 1 wherein for said first three-stage Clos network, said output multiplexer region implements a first stage, said first global interconnect line implements a second stage, and said input multiplexer region implements a third stage.

3. The programmable logic device of claim 1 wherein for said second three-stage Clos network, said input multiplexer region implements a first stage, said second global interconnect line implements a second stage, and said output multiplexer region implements a third stage.

4. The programmable logic device of claim 1 wherein the logical functions within the plurality of logic elements are implemented by configuring SRAM cells.

5. The programmable logic device of claim 1 wherein routing of logical signals to and from the plurality of logic elements is programmably selected by way of SRAM cells.

6. The programmable logic device of claim 1 wherein a fan-out of a middle stage of each of the first and second three-stage Clos networks is 0, so an input to the middle stage is routed to only one output of the middle stage, to provide provable routability.

7. A programmable logic device comprising:
    a plurality of logic array blocks;
    a first plurality of global interconnect lines coupling said plurality of logic array blocks; and
    a second plurality of global interconnect lines coupling said plurality of logic array blocks,
    wherein each of said plurality of logic array blocks comprises:
        a plurality of logic elements configurable to implement logical functions;
        an input multiplexer region coupled to said plurality of logic elements, a first line of said first plurality of global interconnect lines, and a second line of said second plurality of global interconnect lines; and
        an output multiplexer region coupled to said plurality of logic elements, said first line, and said second line,
        wherein said output multiplexer region, said first line, and said input multiplexer region implement a first three-stage Clos network, and
        wherein said input multiplexer region, said second line, and said output multiplexer region implement a second three-stage Clos network.

8. The programmable logic device of claim 7 wherein the logical functions within each of the plurality of logic elements are implemented by configuring SRAM cells.

9. The programmable logic device of claim 7 wherein routing of logical signals to and from each of the plurality of logic elements is programmably selected by way of SRAM cells.

10. The programmable logic device of claim 7 wherein a fan-out of a middle stage of each of the first and second three-stage Clos networks is 0, so an input to the middle stage is routed to only one output of the middle stage, to provide provable routability.

11. The programmable logic device of claim 7 wherein for said first three-stage Clos network, said output multiplexer region implements a first stage, said first line implements a second stage, and said input multiplexer region implements a third stage.

12. The programmable logic device of claim 7 wherein for said second three-stage Clos network, said input multiplexer region implements a first stage, said second line implements a second stage, and said output multiplexer region implements a third stage.

13. The programmable logic device of claim 7 wherein said first plurality of global interconnect lines and said second plurality of global interconnect lines are connected at a plurality of intersections.

14. The programmable logic device of claim 7 further comprising:
- a plurality of input-output drivers coupled to at least one of said first plurality of global interconnect lines and said second plurality of global interconnect lines.

15. The programmable logic device of claim 7 wherein:
- said first plurality of global interconnect lines is a plurality of global horizontal interconnect lines; and
- said second plurality of global interconnect lines is a plurality of global vertical interconnect lines.

16. The programmable logic device of claim 7 wherein:
- said first three-stage Clos network is further implemented by said output multiplexer region of each of said plurality of logic array blocks, said first plurality of global interconnect lines, and said input multiplexer region of each of said plurality of logic array blocks.

17. The programmable logic device of claim 7 wherein:
- said second three-stage Clos network is further implemented by said input multiplexer region of each of said plurality of logic array blocks, said second plurality of global interconnect lines, and said output multiplexer region of each of said plurality of logic array blocks.

18. The programmable logic device of claim 7 wherein each of said plurality of logic array blocks further comprises:
- a second plurality of logic elements configurable to implement logical functions; and
- a second input multiplexer region coupled to said second plurality of logic elements, said first line, and a third line of said second plurality of global interconnect lines,
- wherein said output multiplexer region is further coupled to said second plurality of logic elements and said third line,
- wherein said first three-stage Clos network is further implemented by said second input multiplexer region, and
- wherein said second three-stage Clos network is further implemented by said second input multiplexer region and said third line.

19. The programmable logic device of claim 18, wherein:
- for said first three-stage Clos network, said output multiplexer region implements a first stage, said first line implements a second stage, and said input multiplexer region and said second input multiplexer region implement a third stage; and
- for said second three-stage Clos network, said input multiplexer region and said second input multiplexer region implement a first stage, said second line and said third line implement a second stage, and said output multiplexer region implements a third stage.

* * * * *